(12) United States Patent
Yamazaki et al.

(10) Patent No.: US 8,047,442 B2
(45) Date of Patent: Nov. 1, 2011

(54) SEMICONDUCTOR DEVICE

(75) Inventors: Shunpei Yamazaki, Tokyo (JP); Yuugo Goto, Kanagawa (JP); Tsutomu Murakawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 386 days.

(21) Appl. No.: 12/275,870

(22) Filed: Nov. 21, 2008

(65) Prior Publication Data

US 2009/0140053 A1 Jun. 4, 2009

(30) Foreign Application Priority Data

Dec. 3, 2007 (JP) ................................. 2007-312163

(51) Int. Cl.
*G06K 19/06* (2006.01)

(52) U.S. Cl. ................. 235/492; 235/451; 235/375

(58) Field of Classification Search .................. 235/492, 235/380, 375, 451; 257/448, 774, 72
See application file for complete search history.

(56) References Cited

U.S. PATENT DOCUMENTS

| 5,605,847 | A | 2/1997 | Zhang | |
|---|---|---|---|---|
| 7,332,381 | B2 | 2/2008 | Maruyama et al. | |
| 7,968,983 | B2* | 6/2011 | Urushihata | 257/676 |
| 2003/0214006 | A1* | 11/2003 | Nakamura et al. | 257/448 |
| 2004/0077134 | A1* | 4/2004 | Takayama et al. | 438/151 |
| 2004/0222533 | A1* | 11/2004 | Nakamura et al. | 257/774 |
| 2007/0212853 | A1 | 9/2007 | Maruyama et al. | |
| 2008/0191214 | A1* | 8/2008 | Hotta | 257/72 |
| 2009/0140255 | A1* | 6/2009 | Kimura et al. | 257/64 |

FOREIGN PATENT DOCUMENTS

| JP | 2006-232449 | 9/2006 |
|---|---|---|
| JP | 2007-150179 | 6/2007 |
| JP | 4015002 | 11/2007 |

* cited by examiner

*Primary Examiner* — Edwyn Labaze
(74) *Attorney, Agent, or Firm* — Nixon Peabody LLP; Jeffrey L. Costellia

(57) ABSTRACT

A semiconductor device in which damages to an element such as a transistor are reduced even when external force such as bending is applied and stress is generated in the semiconductor device. The semiconductor device includes a first island-like reinforcement film over a substrate having flexibility; a semiconductor film including a channel formation region and an impurity region over the first island-like reinforcement film; a first conductive film over the channel formation region with a gate insulating film interposed therebetween; a second island-like reinforcement film covering the first conductive film and the gate insulating film.

25 Claims, 21 Drawing Sheets

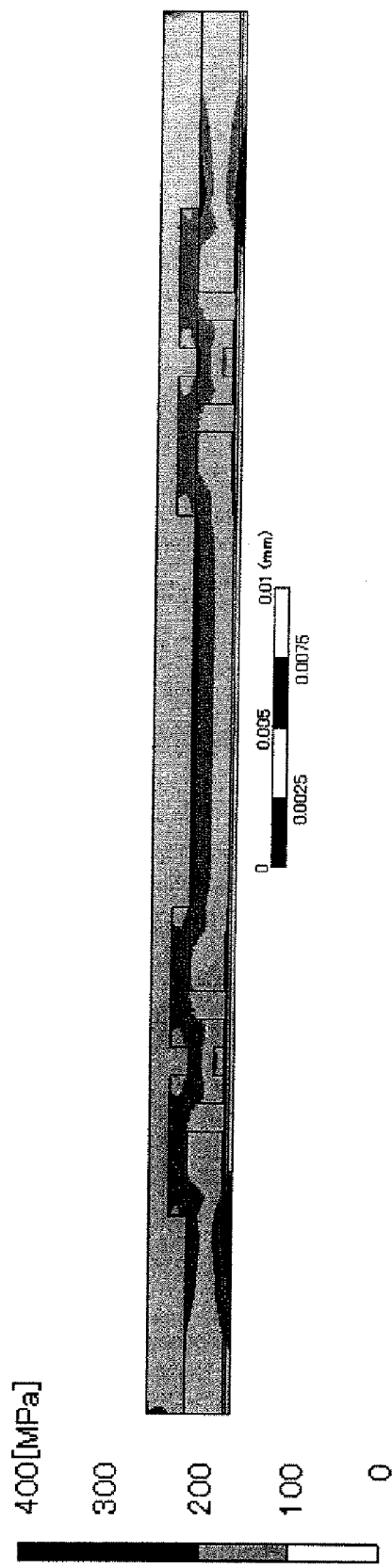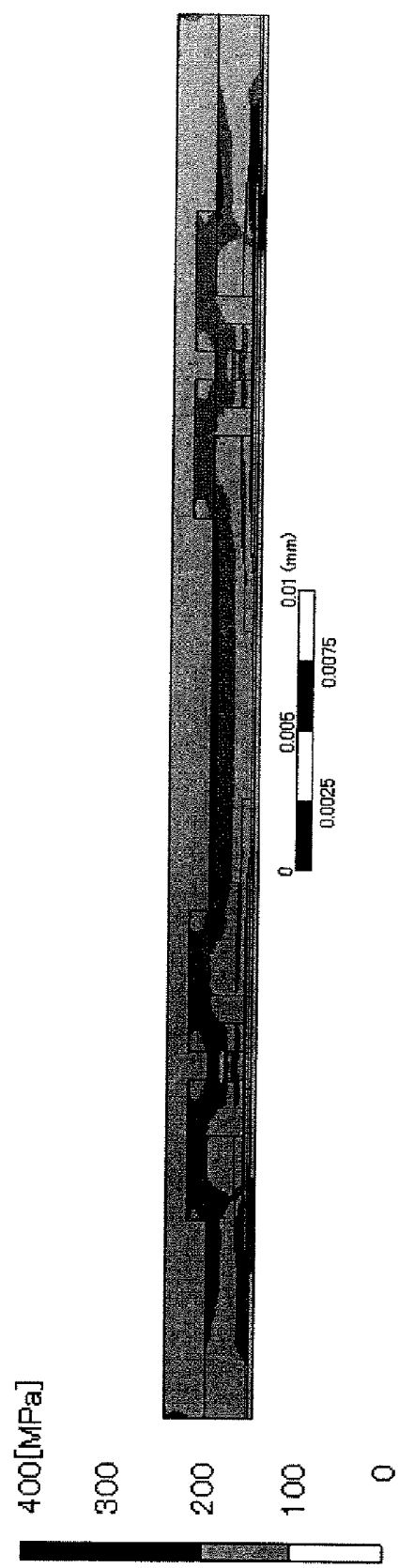

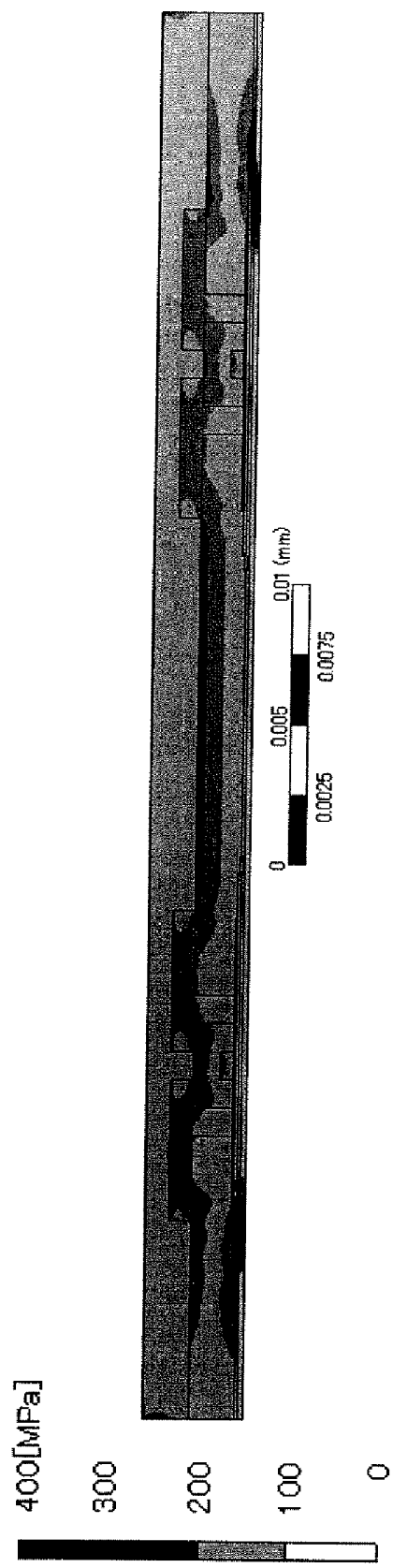
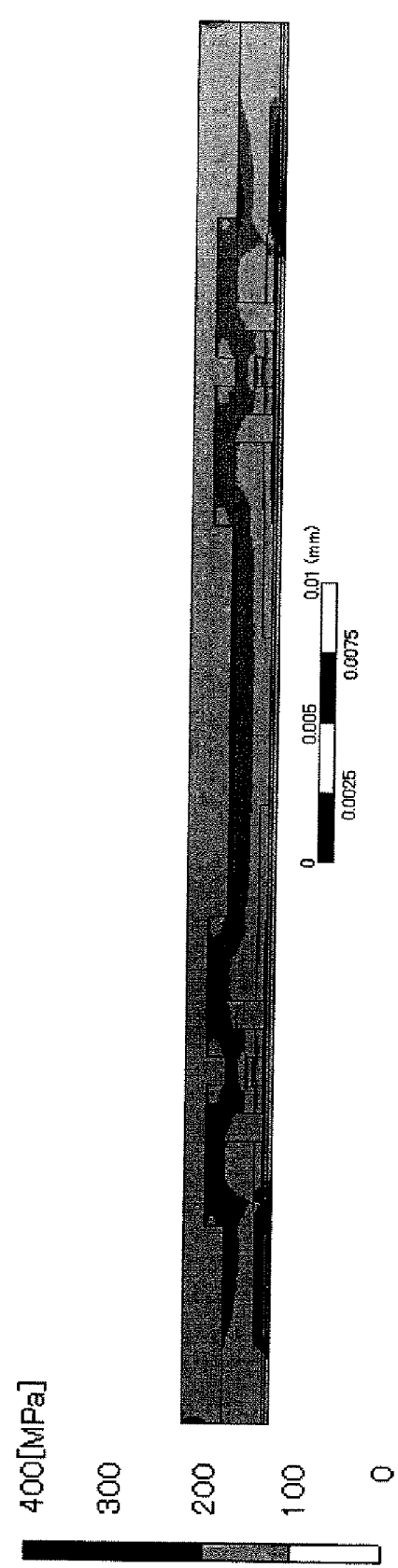
FIG. 19A
FIG. 19B

SEMICONDUCTOR DEVICE

BACKGROUND OF THE INVENTION

1. Field of the Invention

The present invention relates to a semiconductor device, in particular, a semiconductor device in which damages of an element such as a transistor provided in the semiconductor device are reduced even when an external force is applied.

2. Description of the Related Art

In recent years, a technique for providing an integrated circuit including a transistor or the like over a flexible substrate such as a plastic substrate has attracted attention. A semiconductor device formed by providing an integrated circuit over a flexible substrate can be reduced in weight, cost, or the like as compared to the case of using a substrate such as a semiconductor substrate or a glass substrate. Since a flexible semiconductor device can be bent for example, it is expected to be applied to various fields and places (Reference 1: Japanese Patent No. 4015002, Reference 2: Japanese Published Patent Application No. 2006-232449, and Reference 3: Japanese Published Patent Application No. 2007-150179).

However, when external force such as bending is externally applied to a semiconductor device including an integrated circuit provided with an element such as a transistor over a flexible substrate, stress caused in the semiconductor device might damage the element such as a transistor which is included in the semiconductor device and adversely affect characteristics of the element. Further, in the manufacturing process of the semiconductor device, the element such as a transistor is stressed and therefore the element might be damaged, which results in reducing the yield of products.

SUMMARY OF THE INVENTION

In view of the above problems, an object of the present invention is to provide a semiconductor device in which damages of an element such as a transistor are reduced even when external force such as bending is externally applied to the semiconductor device.

An aspect of the present invention is a semiconductor device in which a reinforcement film is provided to suppress generation of stress in an element such as a transistor, even when external force such as bending is applied to the semiconductor device, in manufacturing the semiconductor device or in use of the completed semiconductor device. The reinforcement film is provided so that, in the thickness direction of a semiconductor device, a neutral plane (a plane which does not expand or contract) in which distortion of stress such as tensile stress or compressive stress is not caused due to deformation such as bending can be located at a preferred position for the semiconductor device.

As a feature of the reinforcement film, the reinforcement film is provided in regions above and below a semiconductor film constituting a part of an element such as a transistor. The reinforcement film may be provided so as to be in contact with the semiconductor film or so as not to be in contact with the semiconductor film with an insulating film interposed therebetween. Hereinafter, a specific structure of a semiconductor device is described.

An aspect of the present invention is a semiconductor device which includes a first island-like reinforcement film over a substrate having flexibility; a semiconductor film including a channel formation region and an impurity region over the first island-like reinforcement film; a first conductive film over the channel formation region with a gate insulating film interposed therebetween; a second island-like reinforcement film covering the first conductive film and the gate insulating film; an interlayer insulating film covering the second island-like reinforcement film and the gate insulating film; and a second conductive film which is electrically connected to the impurity region through an opening portion, over the interlayer insulating film, and in which an entire region of the channel formation region is formed between the first island-like reinforcement film and the second island-like reinforcement film.

As a feature of the first island-like reinforcement film and the second island-like reinforcement film, the first island-like reinforcement film and the second island-like reinforcement film are formed using a material higher Young's modulus than the semiconductor film. Specifically, the first island-like reinforcement film and the second island-like reinforcement film are formed using silicon nitride, silicon nitride oxide, metal oxide, metal nitride or the like. By forming the first island-like reinforcement film and the second island-like reinforcement film using a material higher Young's modulus than the semiconductor film, the mechanical strength of the semiconductor film can be increased and damages to the semiconductor film can be reduced without changing the properties of the semiconductor film.

As another feature, a thickness of the first island-like reinforcement film is from 50 nm to 200 nm, and a thickness of the second island-like reinforcement film is from 100 nm to 400 nm.

By provision of a reinforcement film in an element such as a transistor constituting a part of a semiconductor device, it is possible to suppress generation of stress in an element such as a transistor, even when external force such as bending is applied to the semiconductor device, in manufacturing the semiconductor device or in use of the completed semiconductor device. Accordingly, damages to an element such as a transistor can be reduced and yield and reliability of a semiconductor device can be increased.

BRIEF DESCRIPTION OF THE DRAWINGS

In the accompanying drawings:

FIGS. 18A and 18B illustrate stress distribution of a semiconductor device obtained by simulation;

FIGS. 19A and 19B illustrate stress distribution of a semiconductor device obtained by simulation;

DETAILED DESCRIPTION OF THE INVENTION

Embodiment Mode

Figure 1A:
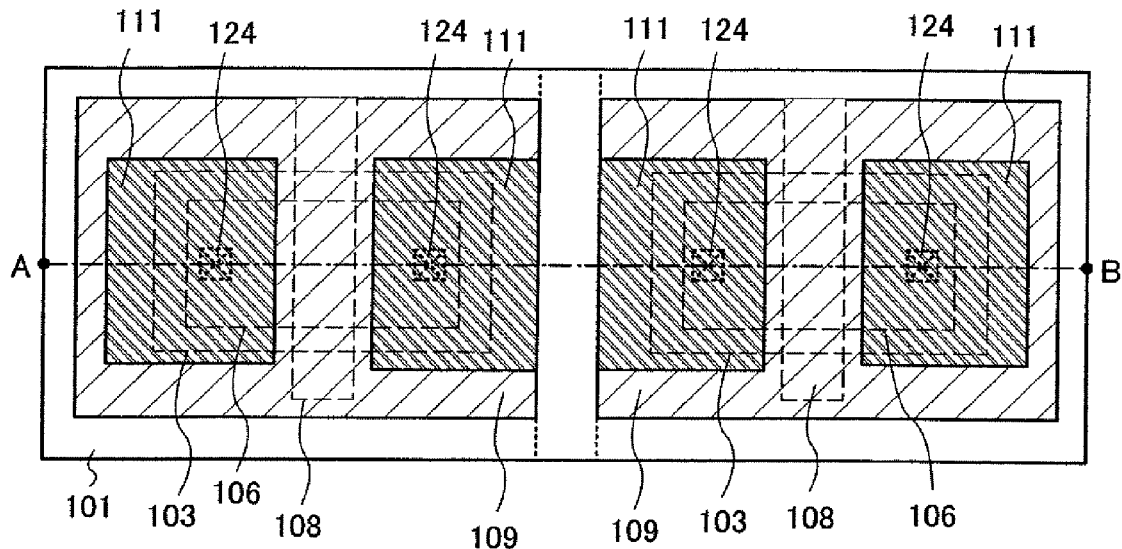
FIGS. 1A to 1C illustrate an example of a semiconductor device.

Embodiment modes of the present invention will be explained with reference to the drawings. However, the present invention is not limited to the description given below and the present invention can be carried out in many different modes, and it is easily understood by those skilled in the art that modes and details herein disclosed can be modified in various ways without departing from the spirit and the scope of the present invention. Therefore, the present invention should not be construed as being limited to the description in the following embodiment modes. Note that in the description of the present invention, like portions are denoted by the same reference numerals in some cases.

Embodiment Mode 1

In Embodiment Mode 1, an example of a semiconductor device will be described with reference to drawings.

In this embodiment mode, a reinforcement film is provided to suppress generation of stress in an element such as a transistor, even when external force such as bending is applied to the semiconductor device. In this embodiment mode, as an example, a case is described where reinforcement films formed from a material having an elastic modulus higher than Young's modulus of the semiconductor film, above and below the semiconductor film constituting a part of the transistor.

Figure 1B:
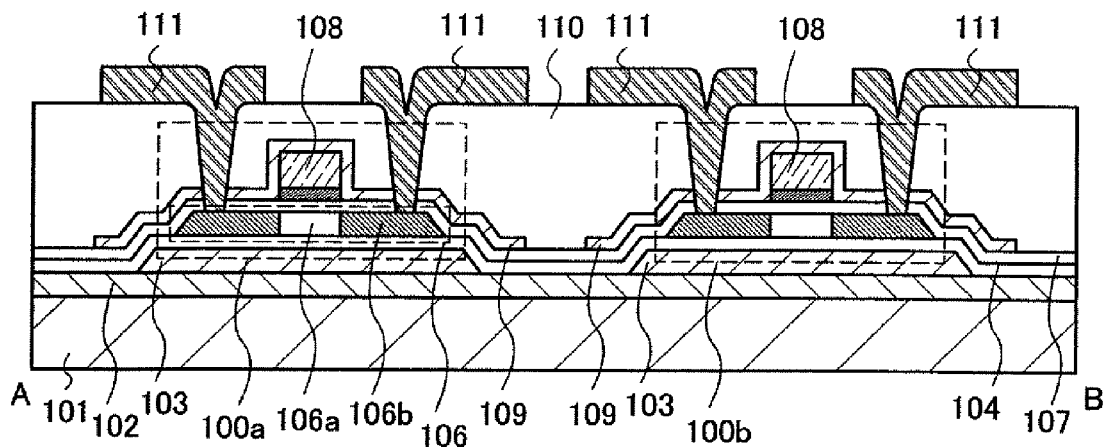
Figure 1C:
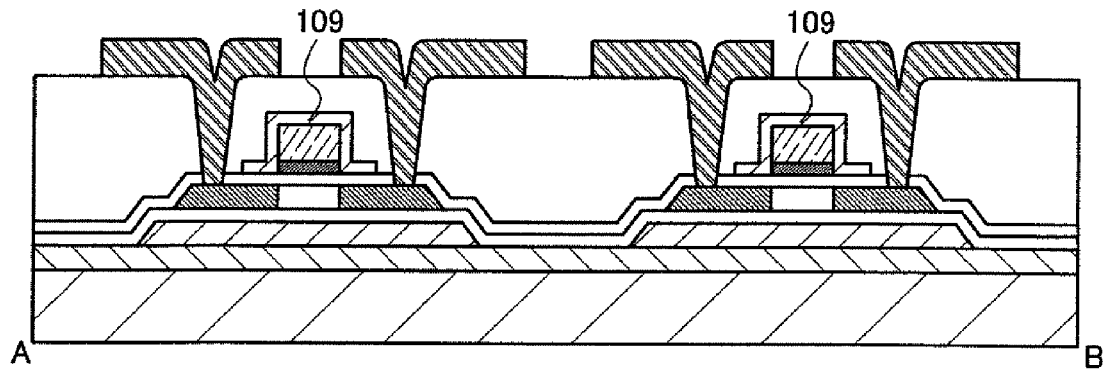

FIGS. 1A to 1C illustrate an example of the semiconductor device described in this embodiment mode. Note that FIG. 1A illustrates a top plan view, and FIG. 1B illustrates a cross-sectional view taken along a line A-B in FIG. 1A.

The semiconductor device illustrated in FIG. 1B has thin film transistors 100a and 100b, which at least include a semiconductor film 106, a gate insulating film 107, a first conductive film 108 serving as a gate electrode, a reinforcement film 103 (also referred to as a first island-like reinforcement film) arranged to reinforce the semiconductor film 106, and a reinforcement film 109 (also referred to as a second island-like film). In FIG. 1B, at least a part of the semiconductor film 106 is interposed between the reinforcement film 103 and the reinforcement film 109. In FIG. 1A, the reinforcement film 109 is provided to cover the semiconductor film 106.

The insulating film 110 is provided to cover the gate insulating film 107 and the reinforcement film 109. In addition, second conductive films 111 capable of functioning as source and drain electrodes of the thin film transistors 100a and 100b are provided over the insulating film 110. Note that an example is shown here in which the thin film transistors 100a and 100b are provided over the substrate 101 having flexibility with the insulating film 102 interposed therebetween.

The semiconductor films 106 each have a channel formation region 106a and impurity regions 106b functioning as source and drain regions. In addition, the impurity regions 106b are formed to be separated from each other, with the channel formation region 106a interposed therebetween. The impurity regions 106b are each electrically connected to the second conductive film 111 formed over the insulating film 110, through an opening portion 124 provided in the insulating film 110.

The reinforcement film 103 is provided so as to overlap with the semiconductor film 106 constituting a part of the thin film transistors 100a and 100b, with the insulating film 104 interposed therebetween. In addition, the area of the reinforcement film 103 is larger than that of the semiconductor film 106.

In addition, the reinforcement film 109 is provided so as to cover the first conductive film 108 and the gate insulating film 107. The reinforcement film 109 is preferably formed to entirely cover the semiconductor film 106. The area of the reinforcement film 109 is preferably larger than that of the reinforcement film 103. As just described, the entire region of the channel formation region is preferably provided between the reinforcement film 103 and the reinforcement film 109.

A stress is generated in the semiconductor film 106, when external force such as bending is applied to the semiconductor device, in manufacturing the semiconductor device or in use of the completed semiconductor device. This is because a position of a neutral plane (a plane which does not expand or contract) in which distortion of stress such as tensile stress or compressive stress is not caused due to deformation such as bending is located at a position where stress is generated in the semiconductor film, in the thickness direction of a semiconductor device. The semiconductor film 106 is damaged due to stress generated in the semiconductor film 106, and thereby the semiconductor device is broken. For this reason, in order to prevent stress from being generated in the semiconductor film due to applied external stress caused by bending or the like to the semiconductor device, the position of the neutral plane (a plane which does not expand or contract) is located at a position where generation of stress can be suppressed in the semiconductor film, in the thickness direction of the semiconductor device.

As a material for each the reinforcement film 103 and the reinforcement film 109, a material having higher Young's modulus than the semiconductor film 106 is preferable. Specifically, a material such as silicon nitride, silicon nitride oxide, metal oxide or metal nitride can be used. In addition, the material of the reinforcement film 103 is preferably the same as that of the reinforcement film 109. As described above, the reinforcement film 103 and the reinforcement film 109 are each formed using a material having higher Young's modulus than the semiconductor film 106, and thus the mechanical strength of the semiconductor film can be increased and damages to the semiconductor film can be reduced, without changing characteristics of the semiconductor film.

Preferably, the thickness of the reinforcement film 103 is from 50 nm to 200 nm, and the thickness of the reinforcement film 109 is from 100 nm to 400. In addition, the thickness of the reinforcement film 109 is preferably larger than that of the reinforcement film 103. Further, the thickness ratio of the reinforcement film 103 to the reinforcement film 109 (the thickness of the reinforcement film 103/the thickness of the reinforcement film 109) is preferably 1/2 or less. Note that the thickness of the reinforcement film 103 may be equal to the thickness of the reinforcement film 109.

In this manner, the semiconductor film 106 is provided so as to be interposed between the reinforcement film 103 and the reinforcement film 109, and thereby a neutral plane in which distortion of stress such as tensile stress or compressive stress is not caused due to deformation such as bending can be located at a position in which stress can be prevented from being generated in the semiconductor film 106, in the thickness direction of the semiconductor device. Therefore, even when external stress such as bending is applied to the semiconductor device, generation of stress in the semiconductor film 106 can be suppressed. In addition, the reinforcement films formed of materials having a Young's modulus higher than the semiconductor film 106 are adjacently provided above and below the semiconductor film 106, and thereby the mechanical strength of the semiconductor device can be increased without changing the properties of the semiconductor film. Therefore, damages of the semiconductor film 106 can be reduced, and damages or possibility of break-down of the thin film transistors 100a and 100b can be reduced.

Note that the semiconductor device illustrated in FIG. 1B is illustrated as an example in which the reinforcement film 109 is provided so as to cover end portions of the semiconductor film 106 and end portions of the reinforcement film 103, but the structure of the semiconductor device described in this embodiment mode is not limited to this example, and the reinforcement film 109 may be provided so as to be overlapped with the channel formation region 106a which is easily damaged.

For example, the reinforcement film 109 may be provided above the channel formation region 106a so as to cover the first conductive film 108 (FIG. 1C). In addition, the area of the reinforcement film 109 may be smaller than that of the reinforcement film 103. By provision of the channel formation region 106a interposed between the reinforcement film 103 and the reinforcement film 109, the neutral plane can be located at the position where generation of stress in the channel formation region 106a can be suppressed, in the thickness direction of the semiconductor device. Thus, even when external stress such as bending is applied to the semiconductor device, generation of stress in the channel formation region 106a can be suppressed. Therefore, damages or opportunities of break-down of the thin film transistors 100a and 100b can be reduced. By provision of the reinforcement films formed of materials having a Young's modulus higher than the semiconductor film 106 above and below the semiconductor film 106, and thereby the mechanical strength of the semiconductor film can be increased without changing the properties of the semiconductor film. Further, there is no need for removing the reinforcement film 109 when an opening portion 124 is formed in the insulating film 110, and thus etching for forming the opening portion 124 can be easily conducted.

Figure 2:
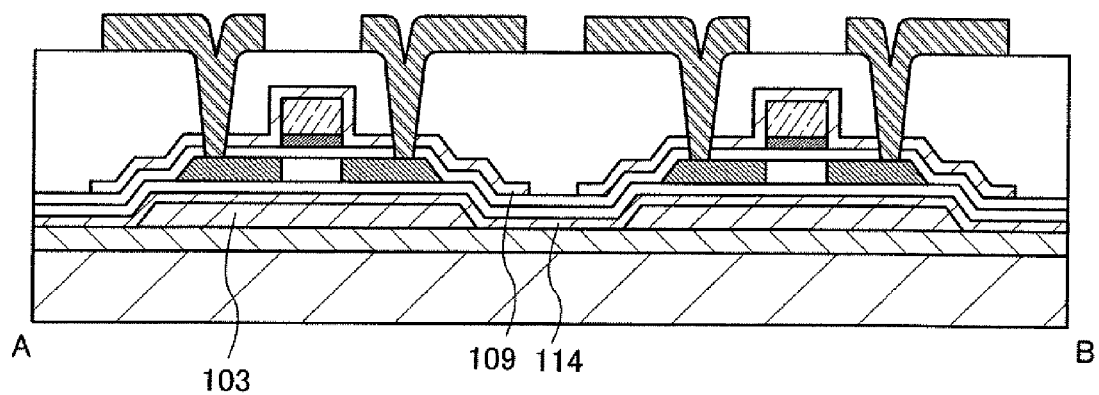
FIG. 2 illustrates an example of a semiconductor device.

In addition, a reinforcement film 114 may be stacked over the reinforcement film 103 (FIG. 2). In this case, the reinforcement film 114 is formed so as to cover the reinforcement film 103 and the insulating film 102. In this manner, by provision of the reinforcement film 114, a lower side of the semiconductor film 106 can be prevented from being subjected to impurities or water. Moreover, the mechanical strength on the lower side of the semiconductor film 106 can be increased. Note that the reinforcement film 114 may be provided over the insulating film 102. When the reinforcement film 103 and the reinforcement film 114 are stacked, the total thickness of the reinforcement film 103 and the reinforcement film 114 is preferably from 50 nm to 200 nm. In addition, the area of the reinforcement film 109 is preferably larger than that of the reinforcement film 103.

Figure 3:
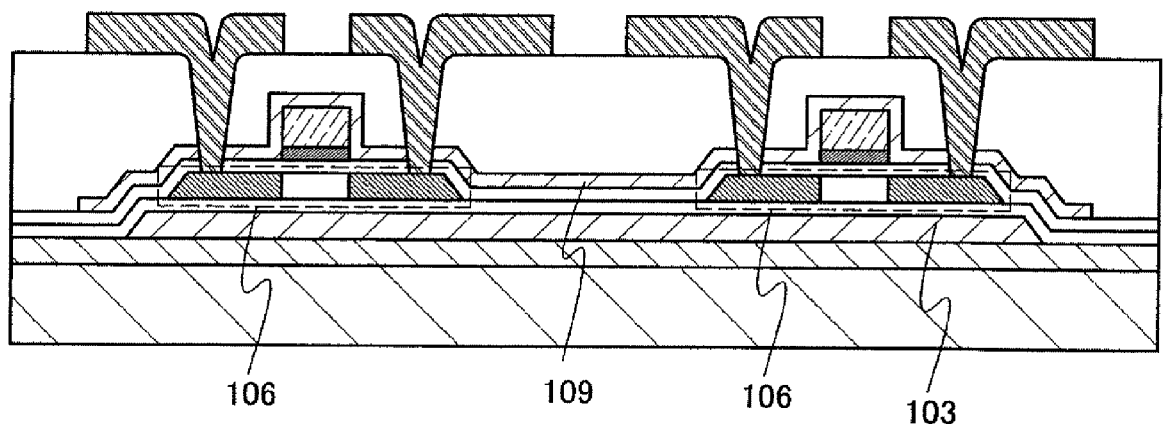
FIG. 3 illustrates an example of a semiconductor device.

Although FIGS. 1A to 1C illustrate the example in which one semiconductor film 106 is provided over one island-like reinforcement film 103, the present invention is not limited to this example. As illustrated in FIG. 3, a plurality of island-like semiconductor films 106 are provided over the one reinforcement film 103. When a plurality of island-like semiconductor films are provided over one reinforcement film 103, steps at an end portion of the reinforcement film 103 can be reduced and thus disconnection of the semiconductor film 106 due to mask misalignment can be prevented.

A first conductive film is provided over the channel formation region included in each island-like semiconductor film 106 with the gate insulating film 107 interposed therebetween. In addition, the reinforcement film 109 is provided so as to cover the gate insulating film 107 and the first conductive film 108, and the insulating film 110 is provided so as to cover the gate insulating film 107 and the first conductive film 108. In addition, the impurity region 106b is electrically connected to the second conductive film 111 formed over the insulating film 110, through the opening portion 124 provided in the insulating film 110.

Note that in this embodiment mode, description is made using the thin film transistor as an example; however, an organic transistor may be provided instead of the thin film transistor.

In this manner, by provision of the reinforcement films formed of materials having higher Young's modulus than the semiconductor film above and below the semiconductor film, a neutral plane in which distortion of stress such as tensile stress or compressive stress is not caused due to deformation such as bending can be located at a position in which stress can be prevented from being generated in the semiconductor film, in the thickness direction of the semiconductor device. In other words, the neutral plane of the semiconductor device can be located at a preferred position for the semiconductor device. Therefore, it is possible to suppress generation of stress in an element such as a transistor, even when external force such as bending is applied to the semiconductor device, in manufacturing the semiconductor device or in use of the completed semiconductor device. Accordingly, damages to an element such as a transistor can be reduced and yield and reliability of a semiconductor device can be increased.

The structure of the semiconductor device described in this embodiment mode can be combined with any structure of the semiconductor devices in the other embodiment modes.

Embodiment Mode 2

In Embodiment Mode 2, an example of a method for manufacturing the semiconductor device described in Embodiment Mode 1 is described with reference to drawings. Note that in this embodiment mode, the process is described in which after an element such as a thin film transistor is formed over a supporting substrate, the element is separated from the supporting substrate to be transferred to another substrate. In this specification, "transfer" means that an element formed over a substrate is moved to another substrate.

Figure 4A:
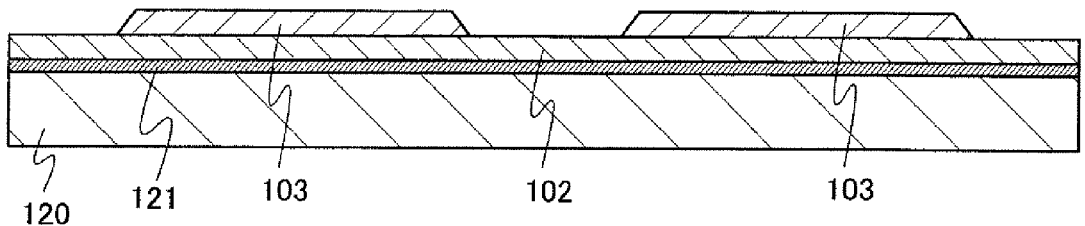
FIGS. 4A to 4E illustrate an example of a manufacturing method of a semiconductor device.

First, a release layer 121 is formed over a surface of a substrate 120, and an insulating film 102 serving as a buffer layer, and a reinforcement film are formed. Note that the release layer 121, the insulating film 102 and the reinforcement film can be formed successively. Then, the reinforcement film is subjected to selective etching using a resist mask formed by a photolithography method, so that an island-like reinforcement film 103 is formed (FIG. 4A).

As the substrate 120, a glass substrate, a quartz substrate, a metal substrate, a stainless steel substrate, or the like can be used. In the case of using such a substrate, the area and the shape thereof are not particularly restricted; therefore, by using as the substrate 120, for example, a rectangular substrate with one side of at least 1 meter, the productivity can be extremely increased. This is a major advantage as compared to the case of using a circular silicon substrate. In addition, the release layer 121 is formed over an entire surface of the substrate 120 in this process; however, the release layer 121 may be selectively provided by a photolithography method after the release layer is formed over an entire surface of the substrate 120 as necessary. In addition, the release layer 121 is formed so as to be in contact with the substrate 120; however, an insulating film may be formed as a base to be in contact with the substrate 120 as necessary and the release layer 121 may be formed so as to be in contact with the insulating film.

As the release layer 121, a metal film, a stacked-layer structure of a metal film and a metal oxide film, or the like can be used. The metal film is formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material which includes any of these elements as a main component, and has a single-layer structure or a stacked-layer structure. In addition, these materials can be formed by using sputtering, various kinds of CVD such as plasma CVD, or the like. In a case where, the stacked-layer structure of a metal film and a metal oxide film, after the aforementioned metal film is formed, plasma treatment in an oxygen atmosphere or an $N_2O$ atmosphere, or heat treatment in an oxygen atmosphere or an $N_2O$ atmosphere is performed so that an oxide or an oxynitride of the metal film can be formed on a surface of the metal film, a metal oxide of tungsten oxide can be formed on the surface of a tungsten film by conducting plasma treatment to the tungsten film.

The insulating film 102 serves as a buffer layer. The insulating film 102 is provided to facilitate separation at the interface between the release layer 121 and the insulating film 102 serving as a buffer layer in a subsequent separation step or to prevent a semiconductor element and a wiring from being cracked or damaged in a subsequent separation step. The insulating film 102 serving as a buffer layer is formed using an inorganic compound to be a single layer or a multilayer by a sputtering method, a plasma CVD method, a coating method, a printing method, or the like. As a typical example of an inorganic compound, silicon oxide ($SiO_x$), silicon nitride ($SiN_x$), silicon oxynitride ($SiO_xN_y$, x>y), silicon nitride oxide ($SiN_xO_y$, x>y) can be given. The thickness of the insulating film 102 serving as a buffer layer is preferably from 10 nm to 1000 nm, more preferably from 100 nm to 700 nm. Here, a silicon oxynitride layer with a thickness of from 500 nm to 700 nm is formed by a plasma CVD method.

Next, a reinforcement film is formed over the release layer 121 by a sputtering method, a plasma CVD method, a coating method, a printing method or the like. As the reinforcement film, silicon nitride, silicon nitride oxide, ceramics such as alumina, metal oxide or metal nitride can be used. By using silicon nitride, silicon nitride oxide or the like, water or a gas such as oxygen can be prevented from entering an element formation layer 134 to be formed later from outside, and the lower side of the semiconductor film can be prevented from being subjected to impurities. In addition, an oxide or a nitride of metal such as tantalum (Ta), tungsten (W), titanium (Ti), molybdenum (Mo), aluminum (Al), copper (Cu), chromium (Cr), niobium (Nb), nickel (Ni), cobalt (Co), zirconium (Zr), zinc (Zn), ruthenium (Ru), rhodium (Rh), palladium (Pd), osmium (Os), iridium (Ir) or the like may be used to form the reinforcement film. The thickness of the reinforcement films is preferably from 50 to 200 nm. In the case, after a silicon nitride film having a thickness of from 50 to 200 nm is formed by a plasma CVD method, selectively etching is conducted using a resist mask formed by a photolithography method so that the island-like reinforcement films 103 are formed.

Figure 4B:
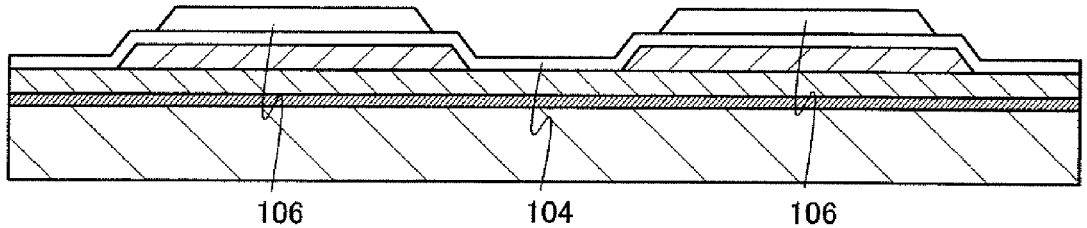

After the insulating film 104 is formed so as to cover the reinforcement films 103 and the insulating film 102, the island-like semiconductor films 106 are formed (see FIG. 4B).

The insulating film 104 functions as a base layer. The insulating film 104 can be appropriately formed using a formation method and a material which are similar to those of the insulating film 102 serving as a buffer layer. Further, the insulating film 104 serving as a base layer may have a stacked-layer structure. In the case where the insulating film serving as the base layer employs a two-layer structure, a silicon nitride oxide film may be formed as a first layer, and a silicon oxynitride film may be formed as a second layer, for example. In the case where the insulating layer serving as the base layer has a three-layer structure, a silicon oxide film, a silicon nitride oxide film, and a silicon oxynitride film may be formed as a first insulating layer, a second insulating layer, and a third insulating layer respectively. Alternatively, a silicon oxynitride film, a silicon nitride oxide film, and a silicon oxynitride film may be formed as a first insulating layer, a second insulating layer, and a third insulating layer respectively. The insulating film serving as the base layer functions as a blocking film for preventing impurities from entering from the substrate 120.

The island-like semiconductor film 106 can be formed by the steps of forming an amorphous semiconductor film, crystallizing the amorphous semiconductor film to be processed into a crystalline semiconductor film, forming a resist mask by a photolithography process, and selectively etching the crystalline semiconductor film.

The amorphous semiconductor film is formed to a thickness of from 25 nm to 200 nm (preferably, from 30 nm to 150 nm) by a sputtering method, an LPCVD method, a plasma CVD method, or the like.

Then, the amorphous semiconductor film is crystallized by laser irradiation. Alternatively, the amorphous semiconductor film may be crystallized by, for example, a method in which laser irradiation is combined with a thermal crystallization method using an RTA or an annealing furnace, or with a thermal crystallization method using a metal element for promoting crystallization.

An example of a manufacturing process of the island-like semiconductor film 106 is briefly described. First, an amorphous semiconductor film with a thickness of 50 to 60 nm is formed by a plasma CVD method. Next, a solution containing nickel, which is a metal element for promoting crystallization, is retained on the amorphous semiconductor film, and then dehydrogenation treatment (at 500° C., for one hour) and thermal crystallization treatment (at 550° C., for four hours) are performed on the amorphous semiconductor film to form a crystalline semiconductor film. Then, laser irradiation is conducted, and a resist mask is formed by a photolithography method. The semiconductor film is selectively etched to form the island-like semiconductor films 106. It is to be noted that without conducting the thermal crystallization which uses the metal element for promoting crystallization, the amorphous semiconductor film may be crystallized only by laser irradiation.

The gate insulating film 107 is formed with a single-layer structure or a stacked-layer structure of a film containing silicon oxide or silicon nitride by a CVD method, a sputtering method, or the like. For example, a single layer of a silicon oxide film, a silicon oxynitride film or a silicon nitride oxide film is formed, or a stacked-layer structure of a silicon oxide film, a silicon oxynitride film and/or a silicon nitride oxide film is formed for the gate insulating film 107.

Alternatively, the gate insulating film 107 may be formed by performing plasma treatment to the semiconductor film 106 to oxidize or nitride the surface thereof. For example, the film is formed by plasma treatment using a mixed gas containing a rare gas such as He, Ar, Kr or Xe, and oxygen, nitrogen oxide ($NO_2$), ammonia, nitrogen, hydrogen, or the like. In that case, if plasma is excited by introduction of a microwave, plasma with a low electron temperature and high density can be generated. With oxygen radical (which may include OH radical) or nitrogen radical (which may include NH radical) generated by high density plasma, oxidizing or nitriding of the surface of the semiconductor film can be conducted.

By treatment using such plasma, an insulating film with a thickness of 1 to 20 nm, typically 5 to 10 nm, is formed over the semiconductor film. A reaction in this case is a solid-state reaction; therefore, an interface state density between the insulating film and the semiconductor film can be remarkably reduced. Since such high-density plasma treatment directly oxidizes (or nitrides) a semiconductor film (crystalline silicon or polycrystalline silicon), variation in thickness of the formed insulating film can be quite small. In addition, even a crystal grain boundary of crystalline silicon is not so strongly oxidized; therefore, a very favorable state can be obtained. That is, by a solid-phase oxidation of the surface of the semiconductor film by the high-density plasma treatment shown here, an insulating film with good uniformity and low interface state density can be formed without abnormal oxidation reaction at a crystal grain boundary.

Note that as the gate insulating film 107, only an insulating film formed by plasma treatment may be used, or a stacked layer may be employed, in which insulating films such as silicon oxide, silicon oxynitride, and/or silicon nitride are formed by a CVD method using plasma or thermal reaction. In any case, a transistor including an insulating film formed by plasma, in a part of the gate insulating film or in the whole gate insulating film, can reduce variation in the characteristics.

The crystalline semiconductor film 106 which is formed by crystallizing the semiconductor film by irradiation with continuous wave laser light or laser light oscillated at a repetition rate of 10 MHz or more, scanning the semiconductor film with the laser beam in one direction, has a feature that crystals grow in the scanning direction of the laser light. A transistor is arranged by adjusting the scan direction to a channel length direction (a direction in which carriers flow when a channel forming region is formed) and the gate insulating film formed by plasma is used for the transistor, and thus, a thin film transistor (TFT) with little characteristic variation and high field effect mobility can be obtained.

Next, a conductive film for forming a gate electrode is formed over the gate insulating film 107. Here, a conductive film 122 and a conductive film 123 are sequentially stacked (see FIG. 4C). The conductive film 122 is formed to a thickness of from 20 nm to 100 nm by a plasma CVD method or a sputtering method, and the conductive film 123 is formed to a thickness of from 100 nm to 400 nm by a plasma CVD method or a sputtering method. The conductive films 122 and 123 can be formed using an element such as tantalum (Ta), tungsten (W), titanium (Ti), molybdenum (Mo), aluminum (Al), copper (Cu), chromium (Cr), niobium (Nb), or the like, or using an alloy or a compound that contains any of such elements as its main component, or an alloy or a compound that contains any of such elements and a silicon (Si) element. Alternatively, the conductive film 122 and the conductive film 123 are formed using a semiconductor material (for example, silicon (Si)) typified by polycrystalline silicon doped with an impurity element such as phosphorus. As examples of a combination of the conductive film 122 and the conductive film 123, a tantalum nitride film and a tungsten film, a tungsten nitride film and a tungsten film, a molybdenum nitride film and a molybdenum film, and the like can be given. Since tungsten and tantalum nitride have high heat resistance, heat treatment for thermal activation can be performed after the conductive film 122 and the conductive film 123 are formed. In addition, in a case of a three-layer structure instead of a two-layer structure, a stacked layer structure of a molybdenum film, an aluminum film, and a molybdenum film may be adopted.

Figure 4C:
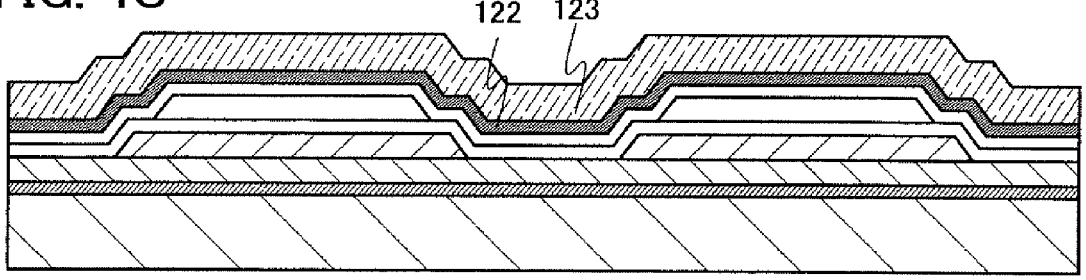
Figure 4D:
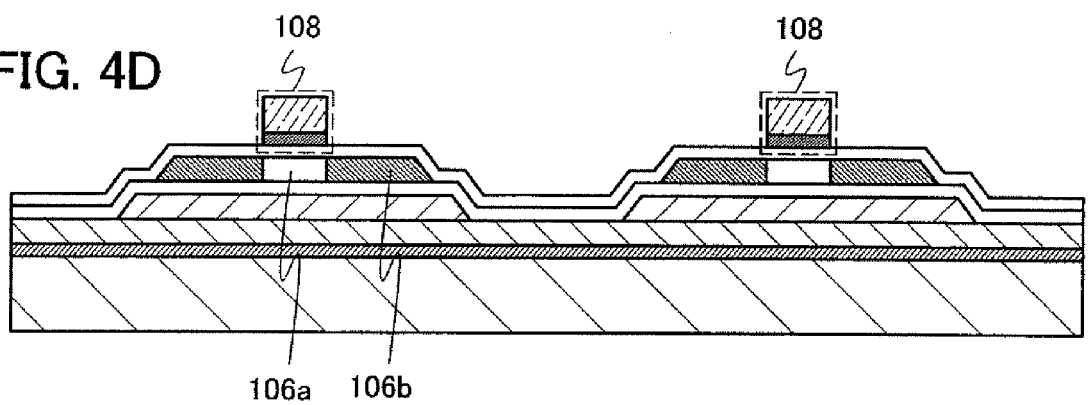

Next, after a resist mask is formed by a photolithography method and the conductive film 122 and the conductive film 123 are selectively etched, thereby the first conductive films 108 are formed, impurity elements are introduced into the semiconductor films 106 by using the first conductive films 108 as masks to form the channel formation regions 106a and the impurity regions 106b (see FIG. 4D). The first conductive films 108 function as gate electrodes (including gate wirings) in the thin film transistor, and the impurity regions 106b function as source and drain regions in the thin film transistor.

Further, as an impurity element to be added, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, phosphorus (P) is used for the impurity element and an n-channel thin film transistor is formed.

Figure 4E:
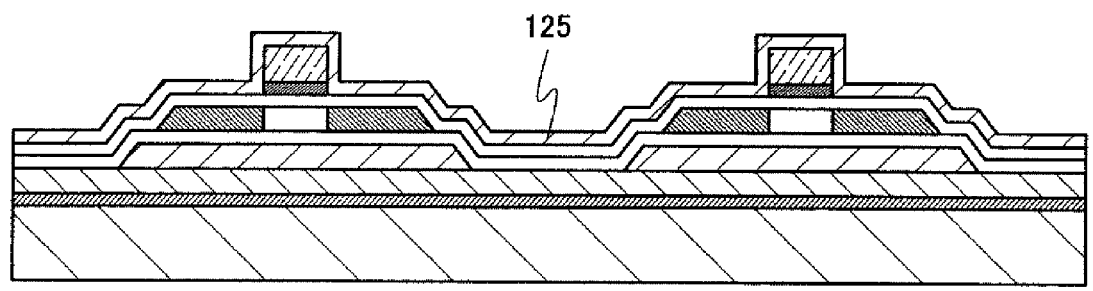

Next, a reinforcement film 125 is formed so as to cover the first conductive film 108 and the gate insulating film 107 (see FIG. 4E).

The reinforcement film 125 can be formed by a method and using a material similar to the reinforcement film 103. The thickness of the reinforcement film 125 is preferably formed to a thickness of from 100 nm to 400 nm.

Figure 5A:
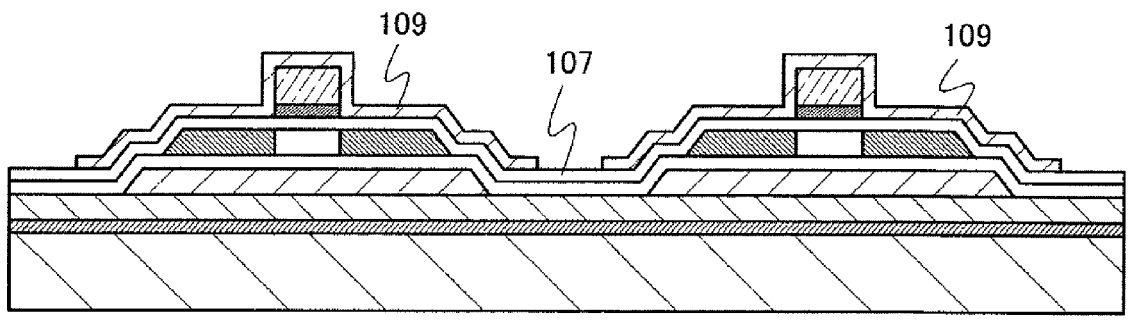
FIGS. 5A to 5C illustrate an example of a manufacturing method of a semiconductor device.

Next, a resist mask is formed by a photolithography process, and the reinforcement film 125 is selectively etched to form a reinforcement film 109 (FIG. 5A). By provision of the semiconductor film 106 interposed between the reinforcement film 103 and the reinforcement film 109 which are each formed of formed of a material having higher Young's modulus than the semiconductor film 106, the neutral plane in which distortion of stress such as tensile stress or compressive stress is not caused due to deformation such as bending can be located at a position in which stress can be prevented from being generated in the semiconductor film 106, in the thickness direction of the semiconductor device. In other words, the neutral plane of the semiconductor device can be located at the best position for the semiconductor device. Therefore, it is possible to suppress generation of stress in the semiconductor film 106, even when external force such as bending is applied to the semiconductor device.

Figure 5B:
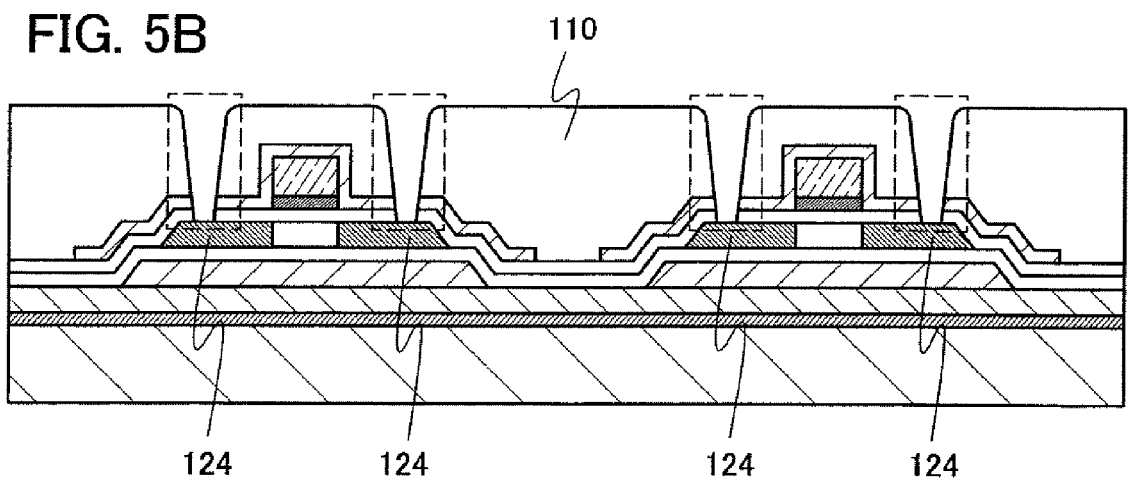

After an insulating film 110 serving as an interlayer insulating film is formed so as to cover the gate insulating film 107 and the reinforcement film 109, opening portions 124 which reach the impurity regions 106b of the semiconductor films 106 are formed to partially expose surfaces of the semiconductor films 106 (see FIG. 5B). At this time, the gate insulating film 107, the reinforcement film 109 and the insulating film 110 are partially etched to form the opening portions 124.

The insulating films 110 can be provided with a single-layer structure or a stacked-layer structure formed using an insulating film including oxygen or nitrogen such as silicon oxide, silicon nitride, silicon oxynitride, or silicon nitride oxide, a film including carbon such as DLC (diamond like carbon), an organic material such as epoxy, polyimide, polyamide, polyvinyl phenol, benzocyclobutene, or acrylic, or a siloxane material such as a siloxane resin.

Figure 5C:
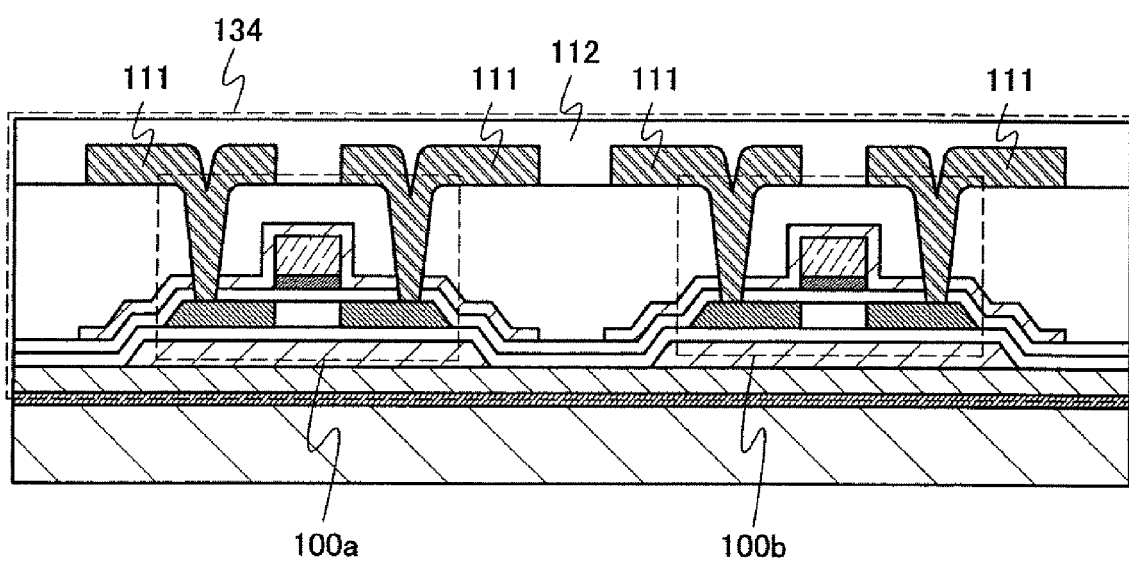

Next, the second conductive films 111 are selectively formed so as to fill the opening portions 124, and an insulating film 112 is formed so as to cover the second conductive films 111 (see FIG. 5C).

The conductive films 111 are each formed of a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing such an element as its main component by a CVD method, a sputtering method, or the like. An alloy material containing aluminum as a main component corresponds to, for example, a material which contains aluminum as a main component and also contains nickel, or a material which contains aluminum as a main component and also contains nickel and one or both of carbon and silicon. Each of the conductive films 111 preferably employs, for example, a stack structure of a barrier film, an aluminum-silicon (Al—Si) film, and a barrier film, or a stack structure of a barrier film, an aluminum-silicon (Al—Si) film, a titanium nitride (TiN) film and a barrier film. Note that the barrier film corresponds to a thin film made of titanium, a nitride of titanium, molybdenum, or a nitride or molybdenum. Aluminum and aluminum-silicon which have low resistance and are inexpensive are optimal materials for forming the conductive films 111. If barrier layers are provided as the upper and lower layers, hillock generation of aluminum or aluminum silicon can be prevented. In addition, if the barrier film is formed of titanium that has high reducing ability, a thin native oxide film which may possibly be formed over the crystalline semiconductor film can be reduced and thus a favorable contact can be obtained between the barrier film and the crystalline semiconductor film. The conductive films 111 may be formed using the same material as the first conductive film 108.

Note that the insulating film 112 can be provided as a single-layer structure or a stacked-layer structure of an insulating film containing oxygen and/or nitrogen, such as silicon oxide, silicon nitride, silicon oxynitride, or silicon nitride oxide; a film containing carbon, such as DLC (diamond-like carbon); a film of an organic material, such as epoxy, polyimide, polyamide, polyvinyl phenol, benzocyclobutene, or acrylic; or a film of a siloxane material, such as a siloxane resin.

Figure 6A:
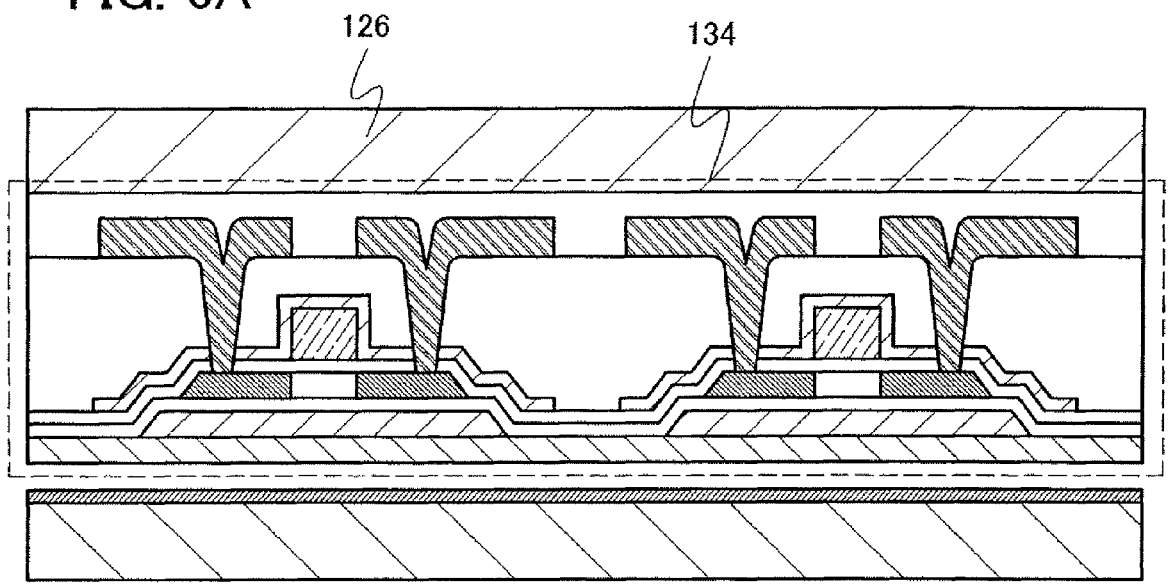
FIGS. 6A and 6B illustrate an example of a manufacturing method of a semiconductor device.

Next, an element formation layer 134 including the thin film transistors 100a and 100b and the like is separated from the substrate 120. Here, opening portions are formed in the element formation layer 134 by laser irradiation (e.g., UV light), and then, one surface (a surface where the insulating film 112 is exposed) of the element formation layer 134 is attached to a first sheet 126 and the element formation layer 134 is separated from the substrate 120 by using physical force (see FIG. 6A).

Alternatively, before the element formation layer 134 is separated from the substrate 120, opening portions may be provided in the element formation layer 134 and an etchant may be introduced into the opening portions; thereby selectively removing the release layer 121. As the etchant, a gas or a solution containing halogen fluoride or an interhalogen compound is used. For example, chlorine trifluoride (ClF$_3$) can be used as the gas containing halogen fluoride.

In general, there is a concern that when the element formation layer 134 is separated from the substrate 120, the thin film transistors 100a and 100b are stressed, and thus the thin film transistors 100a and 100b might be damaged. By provision of the semiconductor film 106 interposed between the reinforcement film 103 and the reinforcement film 109 which are each formed of formed of a material having higher Young's modulus than the semiconductor film 106, it is possible to suppress generation of stress in the semiconductor film 106, even when external force such as bending is applied to the element formation layer 134. Therefore, damages or opportunities of break-down of the thin film transistors 100a and 100b can be reduced. In particular, in the case where an element such as a transistor is formed over a supporting substrate and then transferred to another substrate, it is highly efficient to provide the reinforcement films 103 and 109.

Note that separation is performed with a separation surface got wet with water or a solution such as ozone water, thereby preventing an element such as the thin film transistor 100a or 100b from being damaged by static electricity or the like.

Figure 6B:
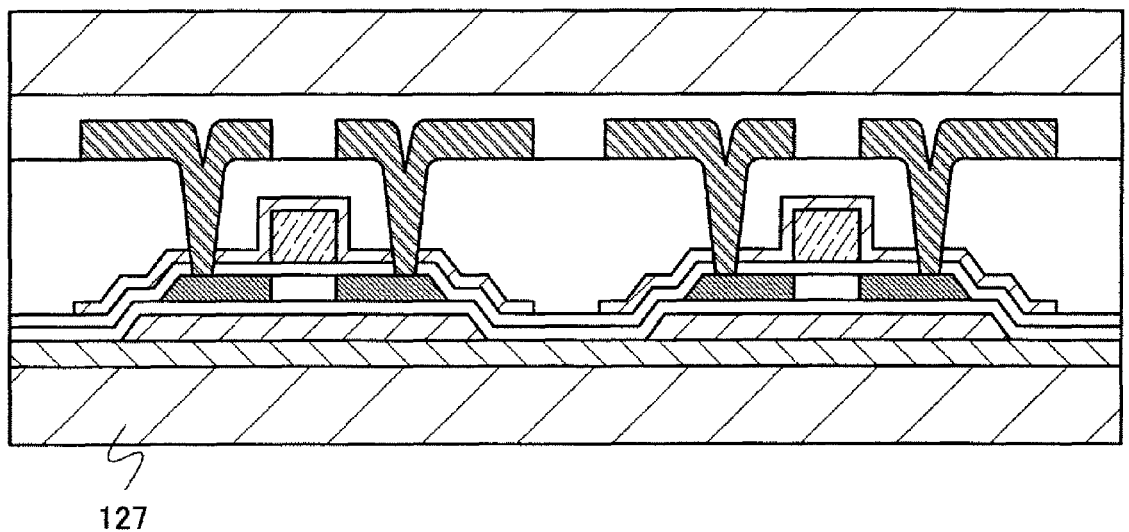

Next, a second sheet 127 is provided on the other surface (the surface separated from the substrate 120) of the element formation layer 134, and then one or both of heat treatment and pressure treatment are performed to attach the second sheet 127 to the element formation layer 134 (see FIG. 6B). As the first sheet 126 and the second sheet 127, a hot-melt film, a plastic film over which an adhesive layer is formed, paper, or the like can be used. Alternatively, thin ceramic may be used for the first sheet 126 and the second sheet 127 in order to increase withstand voltage, or a sheet in which a fabric formed of carbon fiber or glass fiber is impregnated with a resin, a so-called prepreg may be used. If a flexible material is used as a material of the first sheet 126 and the second sheet 127, a semiconductor device which is suitable for being attached to a curved surface of an article can be provided.

As the first sheet 126 or the second sheet 127, a film subjected to antistatic treatment for preventing static electricity or the like (hereinafter referred to as an antistatic film) can be used as well. As the antistatic film, a film with an antistatic material dispersed in a resin, a film with an antistatic material attached thereto, and the like can be given as examples. With respect to a film to which an antistatic material is attached, the antistatic material may be provided to one surface of the film, or the antistatic material may be provided to both surfaces of the film. In addition, the film with an antistatic material provided for one of its surfaces may have the antistatic material on the inner side of the film or the outer side of the film. Note that an antistatic material may be provided over the entire surface or a part of a film. As the antistatic material, metal, indium tin oxide (ITO), surfactant such as ampholytic surfactant, cationic surfactant and nonionic surfactant, or the like can be used. In addition, a resin material containing cross-linked copolymer that has a carboxyl group and a quaternary ammonium group in side chains, and the like can be used as the antistatic material. By attaching such a material to the film, kneading such a material into the film, or applying such a material to the film, the antistatic film can be completed. By sealing the element formation layer with the antistatic film, a semiconductor element can be prevented from being adversely affected by static charge and the like from outside when dealing a semiconductor device as a product.

At the same time or after provision of the second sheet 127, the first sheet material 126 may be separated. By removing the first sheet material 126, a semiconductor device can be formed thinner. Note that, in that case, as the first sheet material 126, a thermal release tape of which adhesiveness is lowered by heat can be used, for example. In addition, a first sheet material or a second sheet material is referred to as a substrate in some cases, and the second sheet 127 corresponds to the substrate 101 in FIGS. 1A and 1B.

The semiconductor device can be manufactured through the above process,

As described above, the reinforcement films which are formed of a material having higher Young's modulus than the semiconductor film are provided above and below the semiconductor film, and thereby the neutral plane in which distortion of stress such as tensile stress or compressive stress is not caused due to deformation such as bending can be located at the position where generation of stress in the semiconductor film can be suppressed, in the thickness direction of the semiconductor device. In other words, the neutral plane of the semiconductor device can be located at a preferred position for the semiconductor device. Therefore, it is possible to suppress generation of stress in an element such as a transistor, even when external force such as bending is applied to a semiconductor device, in manufacturing the semiconductor device or in use of the completed semiconductor device. Accordingly, damages to an element such as a transistor can be reduced and yield and reliability of a semiconductor device can be increased.

Note that, in this embodiment mode, the process is described in which after a thin film transistor is formed over a supporting substrate, the element is separated from the supporting substrate to be transferred to another substrate; however, the manufacturing method described in this embodiment mode is not restricted to this process. For example, the thin film transistors 100a and 100b may be directly provided over the substrate 101. In that case, it is acceptable that the substrate 101 is used instead of the substrate 120 and the release layer 121 is not be provided in the above process. As the substrate 101, a glass substrate, a quartz substrate, or a metal substrate such as a stainless steel substrate, a plastic substrate, or the like may be used.

The method for manufacturing a semiconductor device, which is described in this embodiment mode, can be combined with a method for manufacturing a semiconductor device that is described in any of the other embodiment modes.

Embodiment Mode 3

In this embodiment mode, the case where, in a thin film transistor of the semiconductor device described in Embodiment Mode 1 or 2, an insulating film is formed to be in contact with a side surface of the first conductive film functioning as a gate electrode and an LDD region is formed below the insulating film is described with reference to drawings.

Figure 7A:
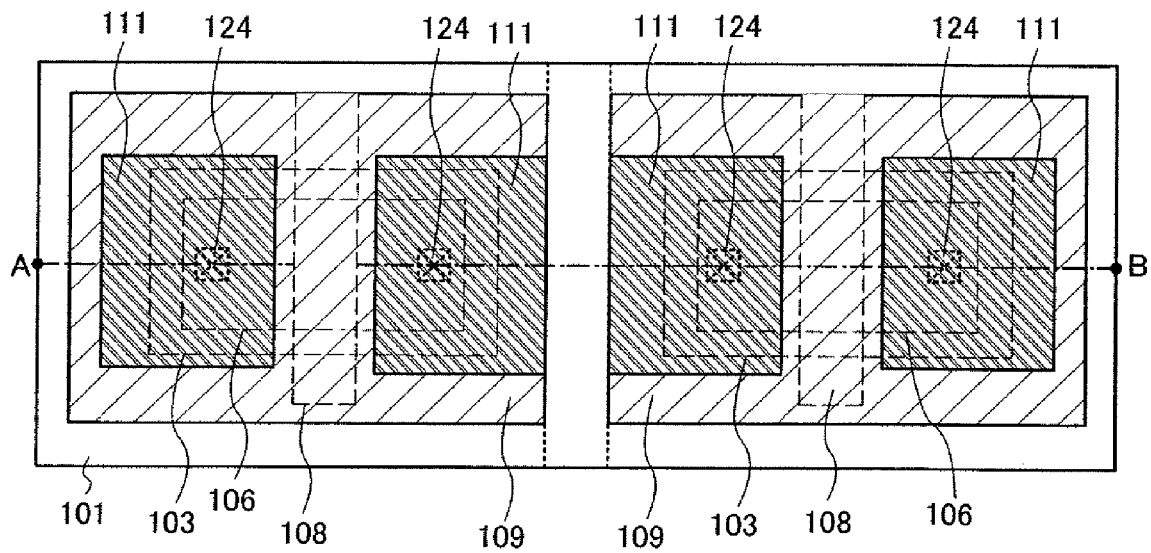
FIGS. 7A and 7B illustrate an example of a semiconductor device.
Figure 7B:
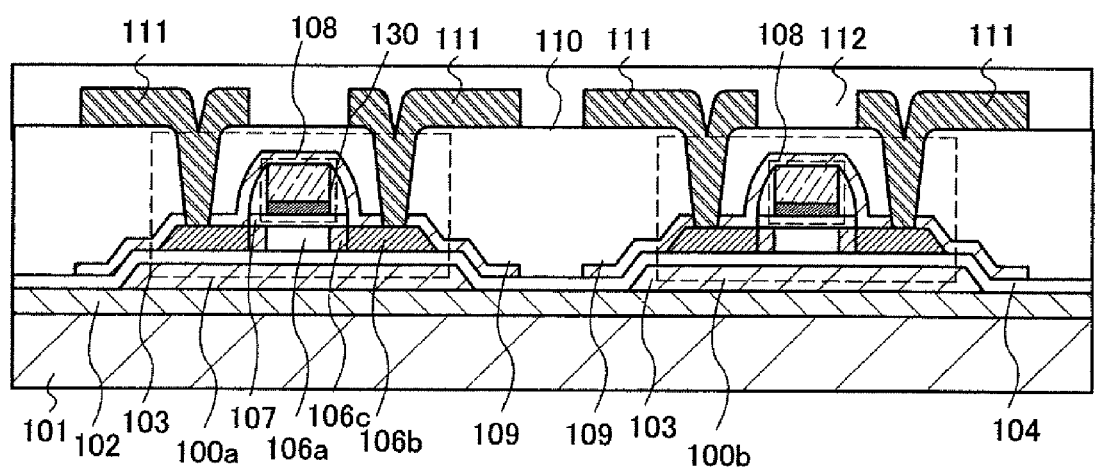

FIGS. 7A and 7B show an example of the semiconductor device described in this embodiment mode. Note that FIG. 7A illustrates a top plan view and FIG. 7B illustrates a cross-sectional view taken along a line A-B in FIG. 7A.

The semiconductor device described in this embodiment mode includes the thin film transistors 100a and 100b, and insulating films 130 are provided to be in contact with a side surface of the first conductive films 108 functioning as gate electrodes, which are included in the thin film transistors 100a and 100b (see FIGS. 7A and 7B). The insulating films 130 are also referred to as side walls, and a structure in which LDD regions are provided below the insulating films 130 can be employed. Note that FIG. 7B illustrates a mode in which the insulating films 130 and the impurity regions 106c functioning as LDD regions are additionally provided for the structure in FIGS. 1A and 1B.

Next, an example of a method for manufacturing the insulating films 130 is described with reference to FIGS. 8A to 8D.

First, a structure up to that of Embodiment Mode 2, which is illustrated in FIG. 4C, is similarly formed, a resist mask is formed by a photolithography method and the first conductive films 108 are formed by selectively etching the conductive film 122 and the conductive film 123. Then, a first impurity element is introduced into the semiconductor films 106 by using the first conductive films 108 as masks, so that the channel formation regions 106a and the impurity regions 128 are formed (see FIG. 8A). As the first impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, the case is described in which phosphorus (P) is used for the impurity element and an n-channel thin film transistor is formed.

Figure 8A:
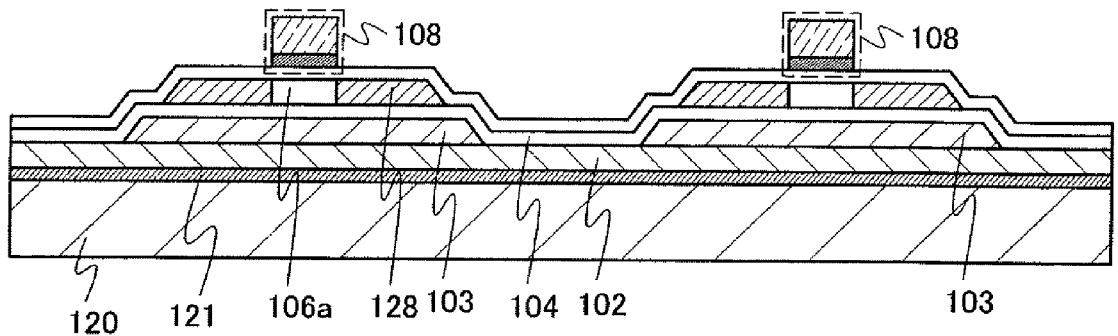
FIGS. 8A to 8D illustrate an example of a manufacturing method of a semiconductor device.
Figure 8B:
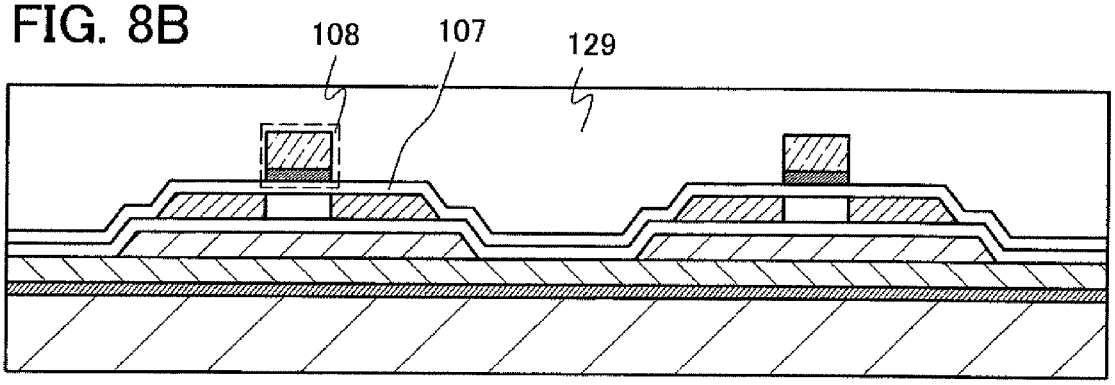
Figure 8C:
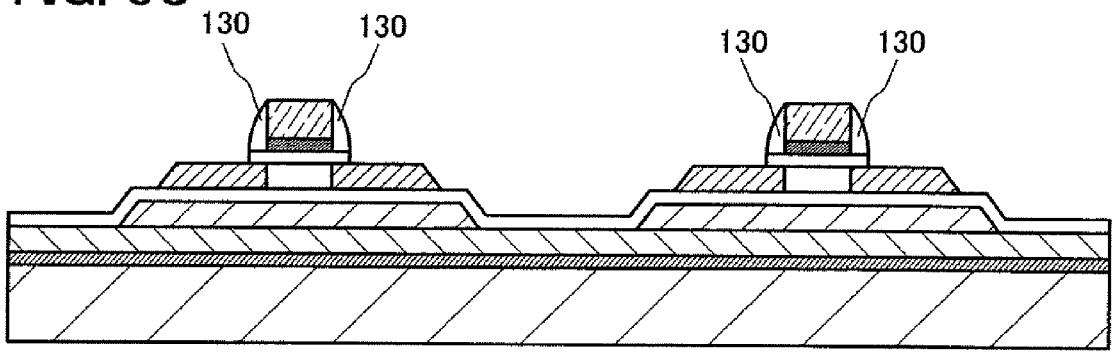

Next, an insulating film 129 is formed so as to cover the first conductive film 108 and the gate insulating film 107 (see FIG. 8B). Each of the insulating films 129 is formed to have a single-layer structure or a stacked-layer structure of a film including an inorganic material such as silicon, an oxide of silicon, or a nitride of silicon, and a film including an organic material such as an organic resin, by a plasma CVD method, a sputtering method, or the like.

Next, the insulating film 129 is selectively etched by anisotropic etching in which etching is mainly done in a perpendicular direction, so that the insulating films 130 (side walls) which are in contact with side surfaces of the first conductive films 108 are formed. Note that there is a case where at the same time as formation of the insulating films 130, the gate insulating films 107 and the insulating film 104 are partially etched to be removed (see FIG. 8C). The gate insulating films 107 are partially removed, and thus a left portion of the gate insulating film 107 is below the first conductive film 108 and the insulating films 130.

Figure 8D:
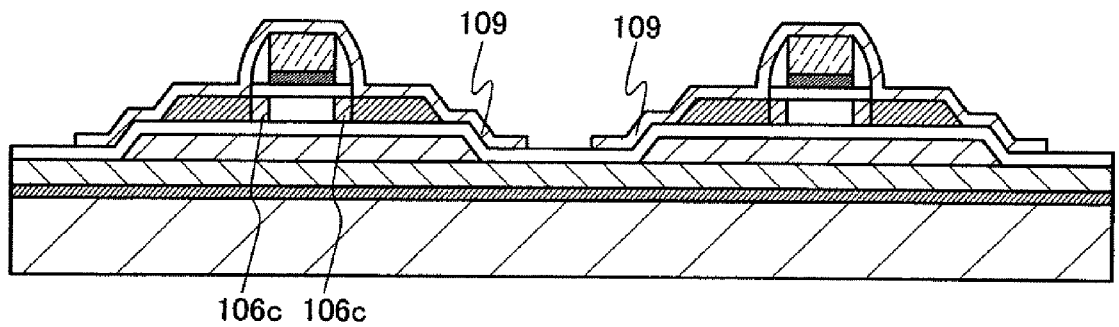

Next, a second impurity element is introduced into the semiconductor films 106 by using the first conductive films 108 and the insulating film 130 as masks, so that the impurity regions 106b functioning as source and drain regions and the impurity regions 106c functioning as LDD regions are formed (see FIG. 8D). As the second impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. In addition, the second impurity element is introduced at higher concentration than the first impurity element described above. Here, phosphorus (P) is used for the impurity element.

Next, the reinforcement films 109 are each formed to cover the semiconductor film 106, the first conductive film 108 and the insulating film 130 (FIG. 8D). The reinforcement film 109 is formed in a manner similar to those in FIGS. 4E and 5A. After that, the semiconductor device illustrated in FIGS. 7A and 7B can be manufactured through the process described in Embodiment Mode 2, which is illustrated in FIG. 5B, FIG. 5C, FIG. 6A and FIG. 6B.

As described above, the semiconductor film 106 is provided so as to be interposed between the reinforcement film 103 and the reinforcement film 109 which are each formed of a material having higher Young's modulus than the semiconductor film 106, and thereby the neutral plane can be located at the position where generation of stress in the semiconductor film 106 can be suppressed, in the thickness direction of the semiconductor device. Therefore, it is possible to suppress generation of stress in the semiconductor film 106, even when external force such as bending is applied to the semiconductor device. In addition, by provision of the reinforcement films formed of a material having higher Young's modulus than the semiconductor film above and below the semiconductor film, the mechanical strength of the semiconductor film can be increased without changing the properties of the semiconductor film. Accordingly, damages to an element such as a transistor can be reduced and yield and reliability of a semiconductor device can be increased.

Figure 9A:
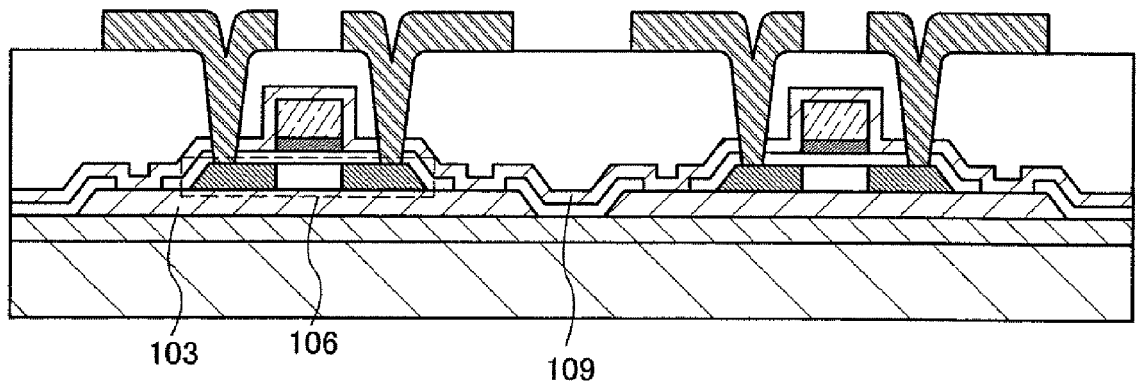
FIGS. 9A and 9B illustrate an example of a semiconductor device.
Figure 9B:
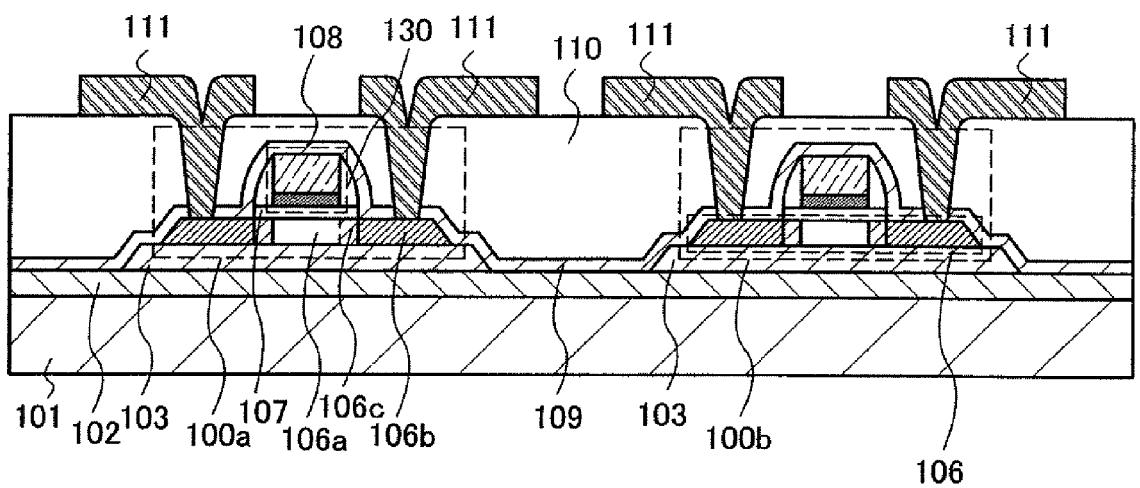

Although FIGS. 7A and 7B, and FIGS. 8A to 8D illustrate the example in which the insulating film 104 is formed over the island-like reinforcement film 103, and the island-like semiconductor film 106 is provided, the present invention is not limited to this example, and as illustrated in FIGS. 9A and 9B, the semiconductor film 106 may be formed over the reinforcement film 103.

In FIG. 9A, the island-like semiconductor film 106 is provided over the island-like reinforcement film 103, opening portions are provided in the gate insulating film 107, and the island-like reinforcement film 103 is in contact with the island-like reinforcement film 109 in the opening portions. In FIG. 9B, the island-like semiconductor film 106 is provided over the island-like reinforcement film 103, and the insulating film 130 is provided in contact with a side face of the first conductive film 108 serving as a gate electrode. The reinforcement film 109 is provided so as to cover the insulating film 102, the island-like reinforcement film 103, the semiconductor film 106, the insulating film 130 and the first conductive film 108, and the island-like reinforcement film 103 is in contact with the island-like reinforcement film 109.

As described above, the semiconductor film 106 is provided so as to be interposed between the reinforcement film 103 and the reinforcement film 109 which are each formed of a material having higher Young's modulus than the semiconductor film 106, and thereby the neutral plane can be located at the position where generation of stress in the semiconductor film 106 can be suppressed, in the thickness direction of the semiconductor device. Therefore, it is possible to suppress generation of stress in the semiconductor film 106, even when external force such as bending is applied to the semiconductor device. In addition, by provision of the reinforcement films formed of a material having higher Young's modulus than the semiconductor film above and below the semiconductor film, the mechanical strength of the semiconductor film can be increased without changing the properties of the semiconductor film. Further, the reinforcement film 103 and the reinforcement film 109 are provided in contact with each other, and thereby the semiconductor film 106 can be prevented from being exposed to impurities or water. Accordingly, damages to an element such as a transistor can be reduced and yield and reliability of a semiconductor device can be increased.

In this manner, by employing the structures illustrated in FIGS. 7A and 7B, FIGS. 8A to 8D and FIGS. 9A and 9B, it is possible to suppress generation of stress in an element such as a transistor, even when external force such as bending is applied to the semiconductor device, in manufacturing the semiconductor device or in use of the completed semiconductor device. Accordingly, damages to an element such as a transistor can be reduced and yield and reliability of a semiconductor device can be increased.

The method for manufacturing a semiconductor device, which is described in this embodiment mode, can be combined with a method for manufacturing a semiconductor device that is described in any of the other embodiment modes.

Embodiment Mode 4

In Embodiment Mode 4, a semiconductor device which is different from those in the above embodiment modes will be described with reference to drawings. In Embodiment Modes 1 to 3, the examples in which the reinforcement film 103 is overlapped with the entire surface of the semiconductor film 106 are described, but the this embodiment mode is not limited to these examples, and the reinforcement film 103 may be overlapped with at least a part of the semiconductor film 106. An example in that case is described with reference to FIGS. 10A and 10B. Note that FIG. 10A illustrates a top plan view and FIG. 10B illustrates a cross-sectional view taken along a line A-B in FIG. 10A.

Figure 10A:
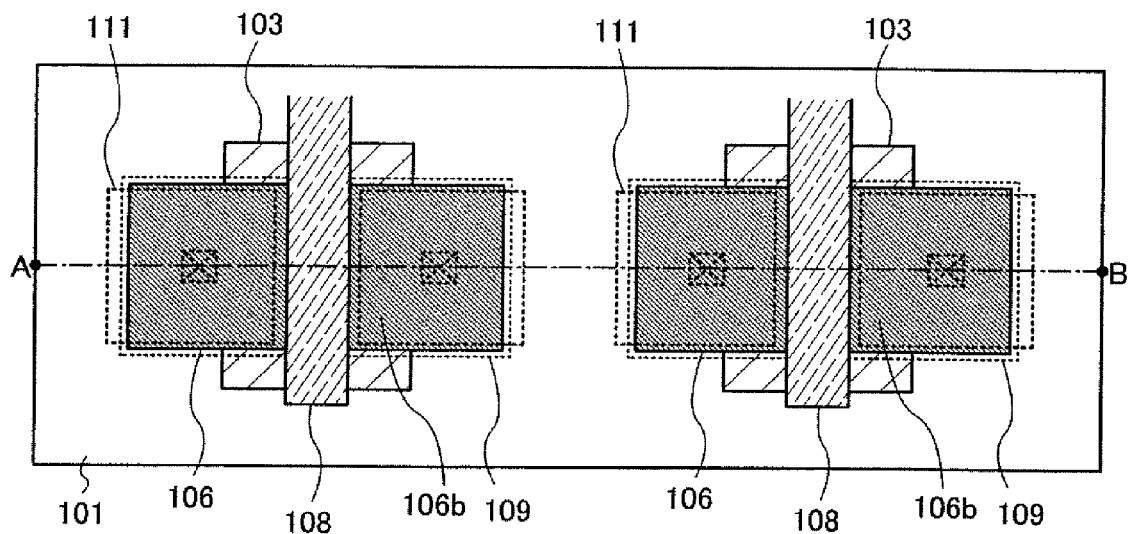
FIGS. 10A and 10B illustrate an example of a semiconductor device.
Figure 10B:
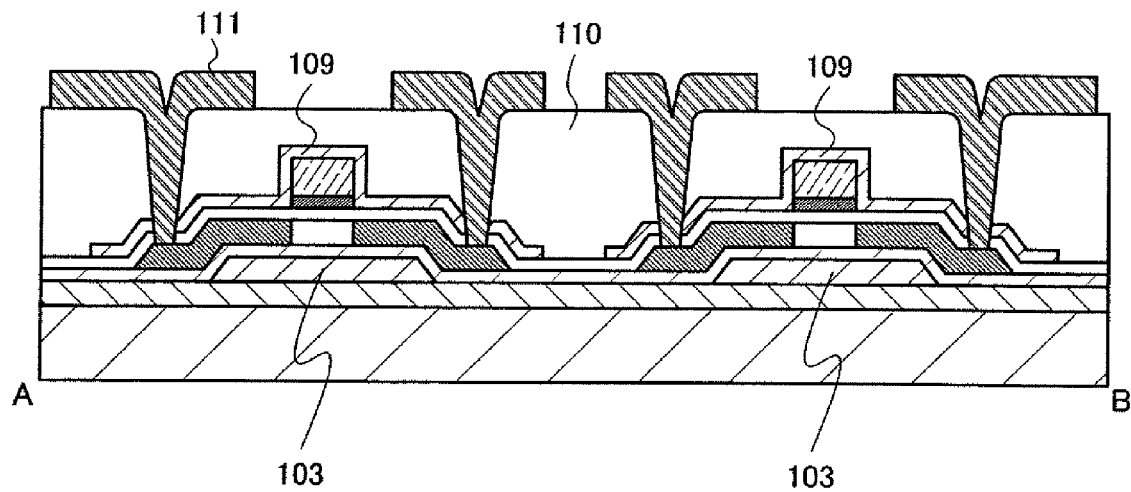

In the semiconductor device illustrated in FIGS. 10A and 10B, the reinforcement film 103 are provided so as to partially overlap with the island-like semiconductor films 106, which are included in the thin film transistors 100a and 100b, with the insulating film 104 interposed therebetween. In the case of providing the reinforcement film 103 in this manner, the reinforcement film 103 is preferably provided so as to overlap with an entire surface of the channel formation region 106a of the semiconductor film 106 and part of the impurity region 106b. This is because the conductive films 108 functioning as gate electrodes cross over the semiconductor films 106 and thereby generating steps at the end portions of the channel formation regions 106a, and if the reinforcement film 103 are provided so as to overlap with a part of the channel formation region 106a, the conductive film 108 and the semiconductor film 106 might be short-circuited.

In the case where the reinforcement film 103 is provided so as to overlap with part of the semiconductor films 106, it is preferable to provide the reinforcement film 103 and the second conductive film 111 so as to overlap with each other. FIGS. 10A and 10B show an example in which end portions of the reinforcement film 103 overlap with end portions of the second conductive films 111. As described above, the reinforcement film 103 and the reinforcement film 109 are provided so as to be overlapped with the second conductive film 111, and thereby the neutral plane in which distortion of stress such as tensile stress or compressive stress is not caused due to deformation such as bending can be located at the position where the semiconductor film can be suppressed, in the thickness direction of the semiconductor device. Therefore, it is possible to suppress generation of stress in an element such as a transistor, even when external force such as bending is applied to the semiconductor device, in manufacturing the semiconductor device or in use of the completed semiconductor device. Accordingly, damages to an element such as a transistor can be reduced and yield and reliability of a semiconductor device can be increased.

Embodiment Mode 5

In Embodiment Mode 5, a semiconductor device which is different from those in the above embodiment modes will be described with reference to drawings. Specifically, a semiconductor device is described in which a film to be a reinforcement film of a thin film transistor or the like is provided above the thin film transistor.

An example of the semiconductor device described in this embodiment mode is described with reference to FIG. 11.

Figure 11:
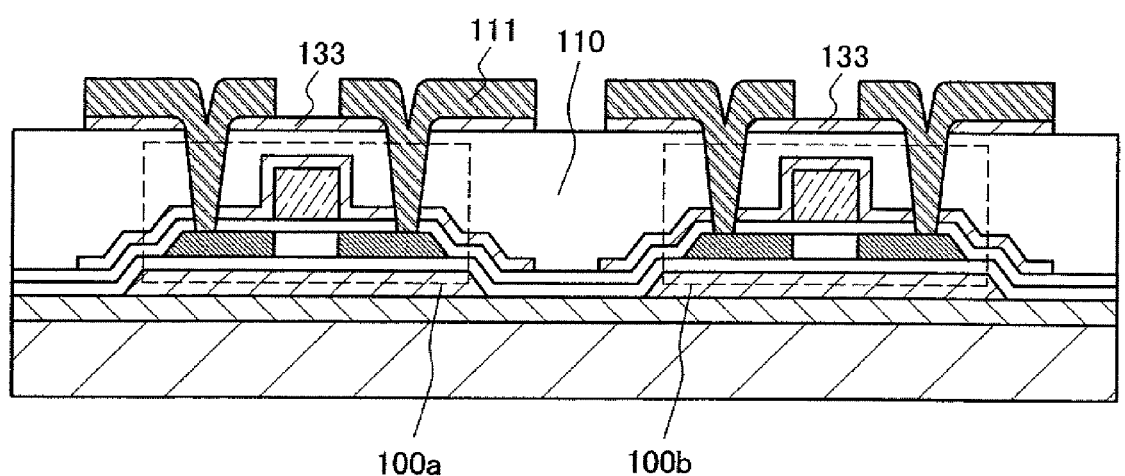
FIG. 11 illustrates an example of a semiconductor device.

In the semiconductor device illustrated in FIG. 11, the reinforcement films 133 are provided over the thin film transistors 100a and 100b with an insulating film (here, the insulating film 110) interposed therebetween. The island-like reinforcement films 133 are provided so as to overlap with the island-like semiconductor films 106, which are included in the thin film transistors 100*a* and 100*b*, with an insulating film or the like interposed therebetween. Further, the reinforcement films 133 are each provided so as to have a larger area than the semiconductor film 106. It is needless to say that each of the reinforcement films 133 do not necessarily overlap with an entire surface of the semiconductor film 106 and each of the reinforcement films 133 may be provided so as to overlap with at least a part of the semiconductor film 106.

As described above, the semiconductor film 106 is provided so as to be interposed between the reinforcement film 103 and the reinforcement film 109 which are each formed of a material having higher Young's modulus than the semiconductor film 106, and thereby the neutral plane can be located at the position where stress generated in the semiconductor film 106 can be suppressed, in the thickness direction of the semiconductor device. Therefore, it is possible to suppress generation of stress in the semiconductor film 106, even when external force such as bending is applied to the semiconductor device. In addition, by provision of the reinforcement films formed of a material having higher Young's modulus than the semiconductor film above and below the semiconductor film, the mechanical strength of the semiconductor film can be increased without changing the properties of the semiconductor film. Accordingly, damages to an element such as a transistor can be reduced and yield and reliability of a semiconductor device can be increased.

Note that the structure of a semiconductor device, which is described in this embodiment mode, can be combined with that described in any of the other embodiment modes.

Embodiment Mode 6

In this embodiment mode, an example of an application of a semiconductor device described in the foregoing embodiment modes is described. Specifically, applications of a semiconductor device which can input and output data without contact will be described with reference to drawings. The semiconductor device which can input and output data without contact is also referred to as an RFID tag, an ID tag, an IC tag, an IC chip, an RF tag, a wireless tag, an electronic tag, or a wireless chip depending on usage modes.

An example of a top view structure of a semiconductor device of this embodiment mode is described with reference to FIG. 12A. A semiconductor device 140 illustrated in FIG. 12A includes a thin film integrated circuit 141 (also referred to as an element formation layer) including a plurality of elements such as thin film transistors which form memory portions and logic portions, and a conductive layer 142 which serves as an antenna. The conductive layer 142 that functions as an antenna is electrically connected to the thin film integrated circuit 141. The thin film transistor or the like according to the present invention described in Embodiment Modes 1 to 5 can be applied to the thin film integrated circuit 141.

Figure 12A:
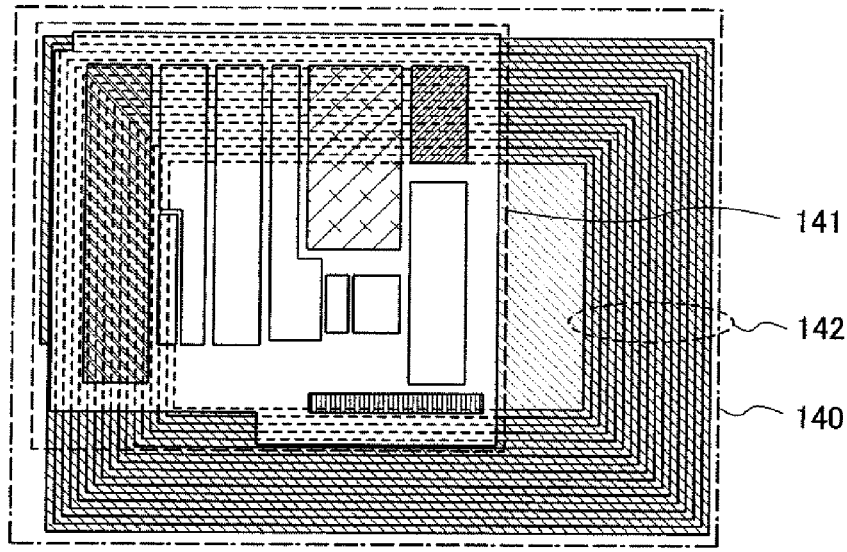
FIGS. 12A to 12C illustrate an example of a semiconductor device.
Figure 12B:
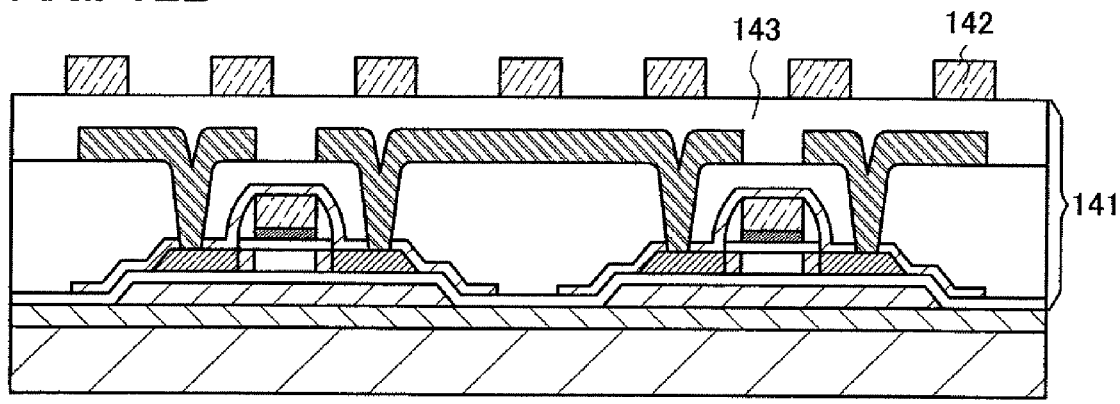
Figure 12C:
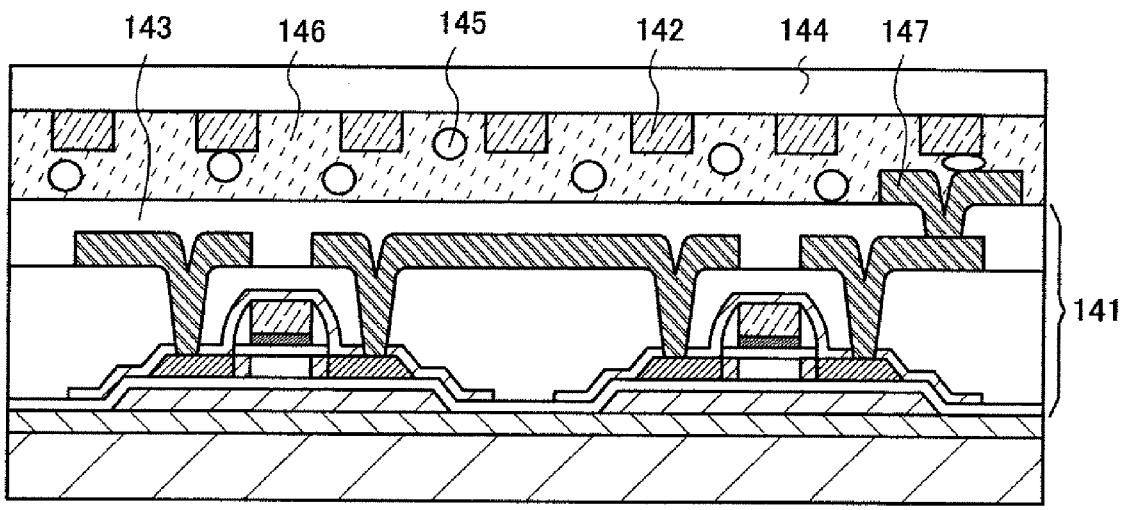

FIGS. 12B and 12C show schematic diagrams of cross sections of FIG. 12A. The conductive layer 142 that functions as an antenna is provided above the elements for forming the memory portion and the logic portion; for example, the conductive layer 142 that functions as an antenna can be provided above the structure described in Embodiment Mode 3 with an insulating film 143 interposed therebetween (see FIG. 12B). The insulating film 143 can be formed using a material similar to the insulating film 112 described in Embodiment Mode 1. Alternatively, the conductive layer 142 which serves as an antenna may be provided separately over a substrate 144 and then the substrate 144 and the integrated circuit 141 may be attached to each other so as to sandwich the conductive layer 142 therebetween (FIG. 12C). Further, the conductive films 147 provided over the insulating film 143 are electrically connected to the conductive films 142 which function as antennas through conductive particles 145 included in an adhesive resin 146.

Note that although this embodiment mode describes an example in which the conductive layer 142 which serves as an antenna has a coil shape and either an electromagnetic induction method or an electromagnetic coupling method is employed, a semiconductor device of this embodiment mode is not limited thereto, and a microwave method may be employed. In the case of a microwave method, the shape of the conductive layer 142 which serves as an antenna may be decided as appropriate depending on the wavelength of an electromagnetic wave.

Figure 13A:
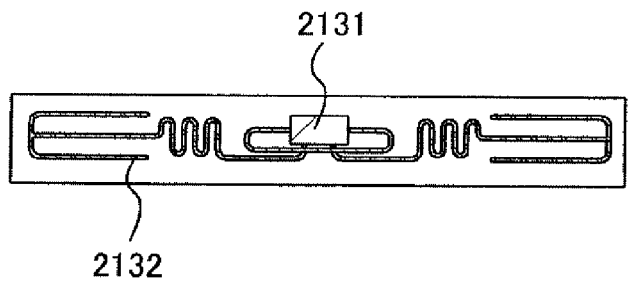
FIGS. 13A to 13D illustrate an antenna which can be applied to a semiconductor device.
Figure 13B:
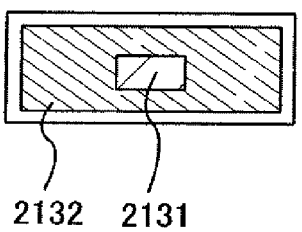
Figure 13C:
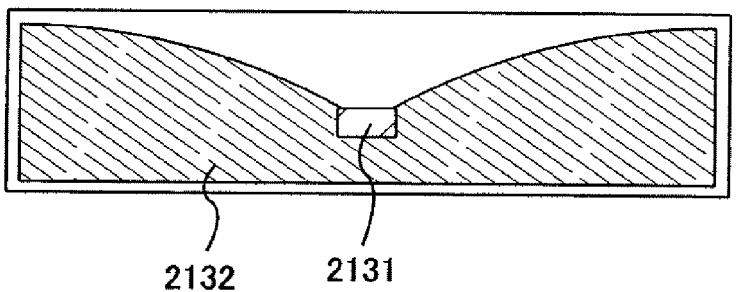
Figure 13D:
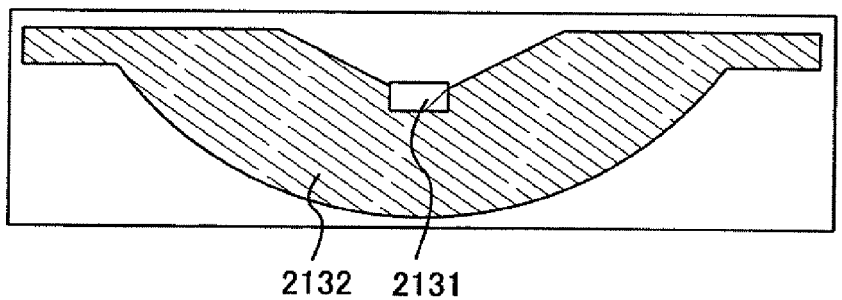

For example, when the microwave method (e.g., with an UHF band (in the range of 860 MHz to 960 MHz), a frequency band of 2.45 GHz, or the like) is employed as the signal transmission method of the semiconductor device 140, the shape such as length of the conductive layer which functions as an antenna may be set as appropriate in consideration of the wavelength of an electromagnetic wave used in sending a signal. For example, the conductive layer which serves as an antenna can be formed into the shape of a line (e.g., a dipole antenna (FIG. 13A)), into the flat shape (e.g., a patch antenna (FIG. 13B)), into the shape of a ribbon (FIGS. 13C and 13D), or the like. The shape of the conductive layer 142 functioning as an antenna is not limited to a linear shape but may be a curved shape, a meandering shape, or a combination thereof in consideration of the wavelength of an electromagnetic wave.

The conductive layer 142 which functions as an antenna is formed of a conductive material by a CVD method, a sputtering method, a printing method such as a screen printing method or a gravure printing method, a droplet discharge method, a dispenser method, a plating method, or the like. The conductive material is any of a metal element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material mainly including the metal element, and a single layer structure or a stacked-layer structure of the above metal element may be employed.

In the case of forming the conductive layer 142 functioning as an antenna by using screen printing, for example, the conductive layer can be provided by selectively printing conductive paste in which conductive particles each having a particle size of several nm to several tens of μm are dissolved or dispersed in an organic resin. As the conductive particle 145, a fine particle or a dispersive nanoparticle of one or more metals of silver (Ag), gold (Au), copper (Cu), nickel (Ni), platinum (Pt), palladium (Pd), tantalum (Ta), molybdenum (Mo), and titanium (Ti) and silver halide can be used. In addition, as the organic resin included in the conductive paste, one or more selected from organic resins functioning as a binder of metal particles, a solvent, a dispersing agent and a coating material can be used. Typically, an organic resin such as an epoxy resin, a silicone resin, and the like can be given. Further, in forming the conductive layer, it is preferable to bake the conductive paste after it is deposited. For example, in the case of using fine particles (e.g., with a grain diameter of from 1 nm to 100 nm) mainly containing silver as a material of the conductive paste, the conductive layer can be formed by baking the conductive paste at a temperature in the range of 150° C. to 300° C. to be hardened. Also, fine particles containing solder, or lead-free solder as their main component may be used, and in this case, fine particles of which the size is 20 µm or less is preferably used. Solder and lead-free solder have an advantage of being low cost.

In this manner, low power consumption can be achieved when the present invention is applied to a semiconductor device to/from which data can be input/output without contact, which is particularly effective in the case of a small semiconductor device.

Next, an operation example of the semiconductor device of this embodiment mode is described.

Figure 14A:
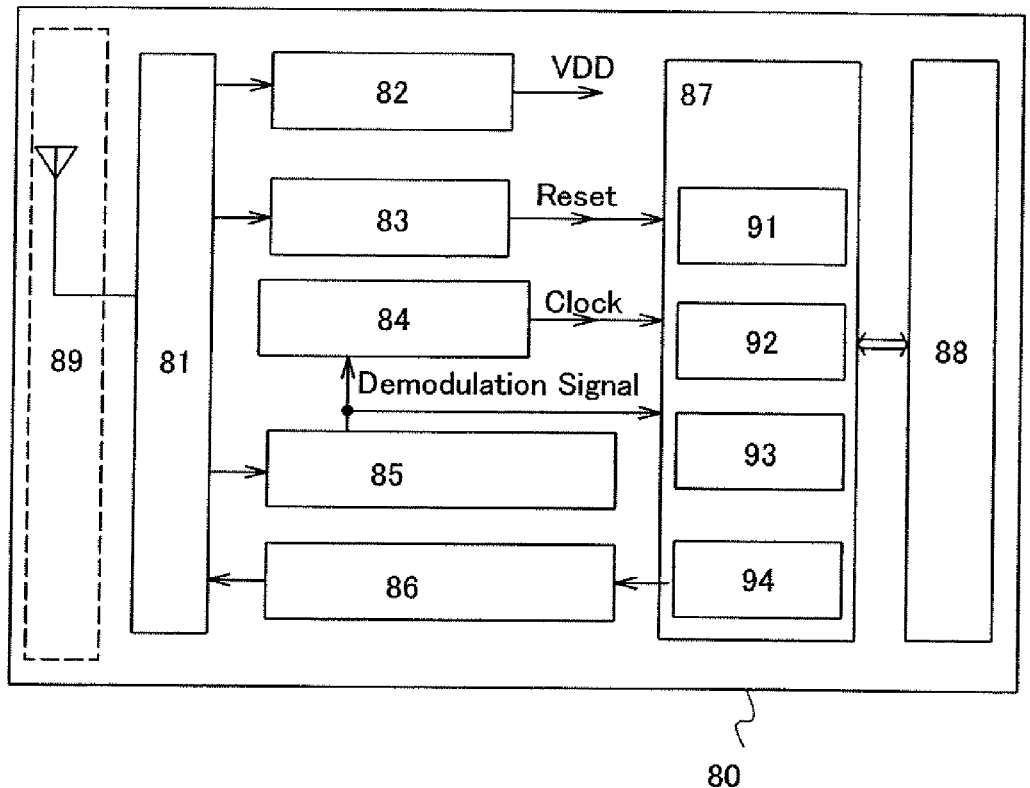
FIGS. 14A to 14C illustrate examples of a block diagram and use modes of a semiconductor device.

A semiconductor device 80 has a function of communicating data without contact, and includes a high frequency circuit 81, a power supply circuit 82, a reset circuit 83, a clock generation circuit 84, a data demodulation circuit 85, a data modulation circuit 86, a control circuit 87 for controlling other circuits, a memory circuit 88, and an antenna 89 (FIG. 14A). The high-frequency circuit 81 receives a signal from the antenna 89 and then outputs a signal received from the data modulation circuit 86, through the antenna 89. The power source circuit 82 generates a power source potential from a received signal. The reset circuit 83 generates a reset signal. The clock generating circuit 84 generates various clock signals based on a received signal input from the antenna 89. The data demodulation circuit 85 demodulates a received signal and outputs to the controlling circuit 87. The data modulation circuit 86 modulates a signal received from the controlling circuit 87. As the control circuit 87, a code extraction circuit 91, a code determination circuit 92, a CRC determination circuit 93, and an output unit circuit 94 are provided for example. It is to be noted that the code extraction circuit 91 is a circuit which separately extracts a plurality of codes included in an instruction transmitted to the control circuit 87. The code determination circuit 92 is a circuit which compares the extracted code and a code corresponding to a reference to determine the content of the instruction. The CRC determination circuit 93 is a circuit which detects the presence or absence of a transmission error or the like based on the determined code. In FIG. 14A, in addition to the control circuit 87, the high-frequency circuit 81, which is an analog circuit, and the power supply circuit 82 are included.

Next, an example of operation of the above-described semiconductor device will be explained. First, a radio signal is received by the antenna 89. The radio signal is transmitted to the power supply circuit 82 via the high frequency circuit 81, and a high power supply potential (hereinafter referred to as VDD) is generated. VDD is supplied to circuits included in the semiconductor device 80. A signal sent to the data demodulation circuit 85 via the high-frequency circuit 81 is demodulated (hereinafter this signal is called a demodulated signal). Further, a signal transmitted through the reset circuit 83 via the high frequency circuit 81 and a demodulated signal transmitted through the clock generation circuit 84 are transmitted to the control circuit 87. The signal transmitted to the control circuit 87 is analyzed by the code extraction circuit 91, the code determination circuit 92, the CRC assessment circuit 93, and the like. Then, in accordance with the analyzed signal, information of the semiconductor device stored in the storage circuit 88 is output. The output information of the semiconductor device is encoded through the output unit circuit 94. Further, the encoded information of the semiconductor device 80 passes through the data modulation circuit 86 and then is sent by the antenna 89 as a wireless signal. Note that a low power source potential (hereinafter called VSS) is common in the plurality of circuits included in the semiconductor device 80 and GND can be used as VSS.

Thus, data of the semiconductor device can be read by transmitting a signal from a reader/writer to the semiconductor device 80 and receiving the signal transmitted from the semiconductor device 80 by the reader/writer.

Further, in the semiconductor device 80, power source voltage may be supplied to each circuit by electromagnetic waves without providing a power supply (a battery), or a power supply (a battery) may be provided so that power supply voltage is supplied to each circuit by both electromagnetic waves and the power supply (the battery).

Figure 14B:
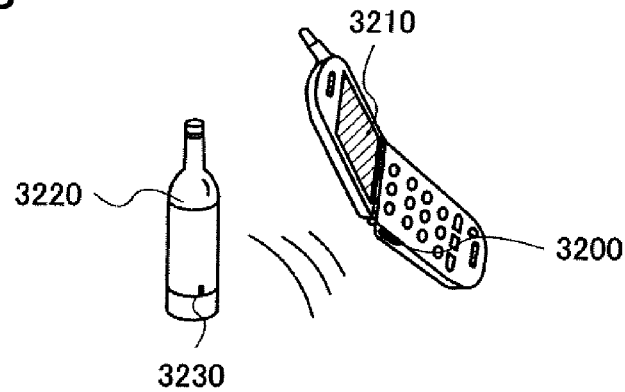
Figure 14C:
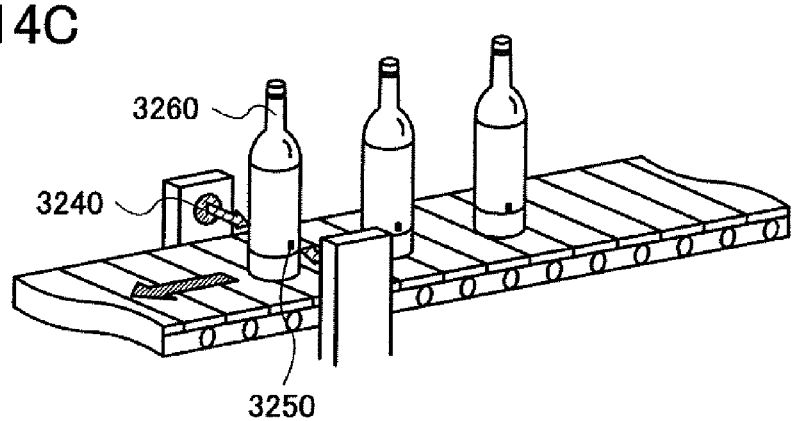

Next, an example of usage of a semiconductor device in which data can be input/output without contact is explained. A side surface of a mobile terminal including a display portion 3210 is provided with a reader/writer 3200. A side surface of a product 3220 is provided with a semiconductor device 3230 (FIG. 14B). When the reader/writer 3200 is held over the semiconductor device 3230 included in the product 3220, the display portion 3210 displays information on the product, such as a material, a production area, an inspection result for each production step, history of circulation process, and description of the product. Further, when a product 3260 is carried by a conveyer belt, the product 3260 can be inspected by using a reader/writer 3240 and a semiconductor device 3250 provided for the product 3260 (see FIG. 14C). As the semiconductor devices 3230 and 3250, the above semiconductor device 80 can be applied. In this manner, by using the semiconductor device according to this embodiment mode in the system, information can be obtained easily and high performance and a high added value are achieved. Further, since the semiconductor device according to this embodiment mode can realize low power consumption, a semiconductor device provided for a product can be downsized.

Note that an applicable range of the semiconductor device according to this embodiment mode is wide in addition to the above, and the semiconductor device can be applied to any product that clarifies information of an object, such as the history thereof, without contact and is useful for production, management, or the like. A semiconductor device of the present invention can be used for any product that is a product (including creatures), because damages of a transistor or the like can be reduced even when external stress such as bending can be applied thereto.

Embodiment Mode 7

In this embodiment mode, examples of usage modes of semiconductor devices of the above embodiment modes will be described. A semiconductor device can be used as a so-called IC label, IC tag, and IC card provided in, for example, bills, coins, securities, bearer bonds, documents (such as drivers licenses or residents cards), packaging containers (such as wrapping paper or bottles), storage media (such as DVD software or video tapes), vehicles (such as bicycles), personal belongings (such as bags or glasses), foods, plants, animals, human bodies, clothing, commodities, products such as electronic devices, or an article such as shipping tags of baggage.

Note that in this specification, "IC cards" mean cards which are formed by embedding a thin integrated circuit (e.g., an IC chip) in a plastic card so as to store data. The IC cards can be categorized into "a contact type" and "a non-contact type" in accordance with a system of reading and writing data. The non-contact type card is incorporated with an antenna, which can communicate with a terminal by utilization of weak radio waves. In addition, an IC tag refers to a small IC chip used for identification of objects (am IC chip for this application is referred to as an ID chip), which stores data such as its own identification code, and is capable of transmitting and receiving data to/from a management system with radio waves. The IC tag having a size of several tens millimeters can communicate with a reader through radio waves or electromagnetic waves. An IC tag that is applied to a semiconductor device which wirelessly communicates data can be used for various applications such as card-form objects, labels (called IC labels), or certificates.

This embodiment mode will describe an application of semiconductor devices of the above embodiment modes and an example of an article provided with the semiconductor devices with reference to FIGS. 15A to 15E.

Figure 15A:
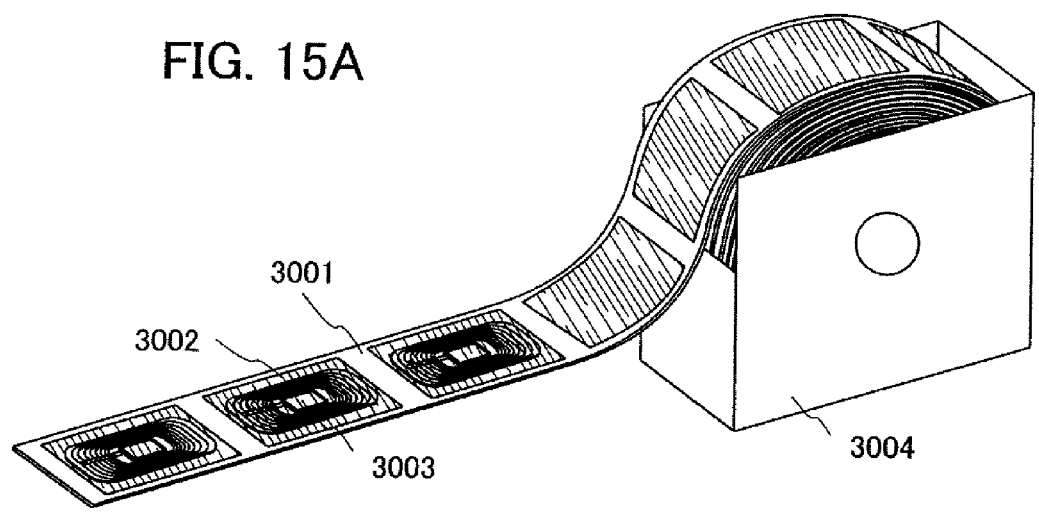
FIGS. 15A to 15E are views each showing an example of a usage mode of a semiconductor device.

FIG. 15A illustrates an example of a state of a completed semiconductor product. A plurality of IC labels 3003 each including a semiconductor device 3002 is formed on a label board (separate paper) 3001. The IC labels 3003 are held in a box 3004. In addition, on the IC label 3003, information about a product or service (a name of the product, brand, trademark, trademark owner, seller, manufacturer, or the like) is written, while an ID number that is unique to the product (or the type of the product) is assigned to the included semiconductor device to make it possible to easily detect forgery, infringement of intellectual property rights such as patent rights and trademark rights, and illegality such as unfair competition. Further, a lot of data which is too much to be written clearly on a container or a label of the product, for example, production area, selling area, quality, raw material efficacy, use, quantity, shape, price, production method, directions for use, production time, time of the use, expiration date, instructions of the product, data on the intellectual property of the product, and the like can be input in the semiconductor device; therefore, a trader and a consumer can access the data with the use of a simple reader. While the producer can also easily rewrite or delete the information, a transactor or consumer is not allowed to rewrite or delete the information in the structure.

Figure 15B:
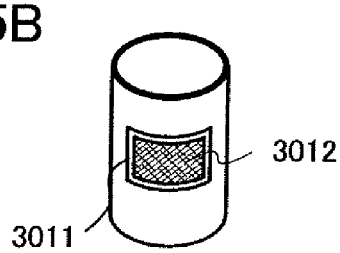

FIG. 15B illustrates an IC tag 3011 with a label form, in which a semiconductor device 3012 is incorporated. By being provided with the IC tag 3011, the products can be managed easily. For example, in the case where the commercial product is stolen, the thief can be figured out quickly by tracing the pathway of the commercial product. Thus, by being provided with the IC tag, products that are superior in so-called traceability can be distributed.

Figure 15C:
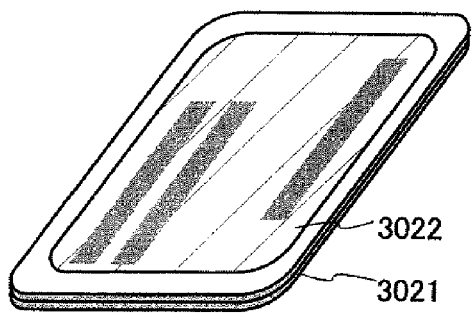

FIG. 15C illustrates an example of the state of a completed product of an IC card 3021 including a semiconductor device 3022. The IC card 3021 includes all kinds of cards such as a cash card, a credit card, a prepaid card, an electronic ticket, electronic money, a telephone card, and a membership card.

Figure 15D:
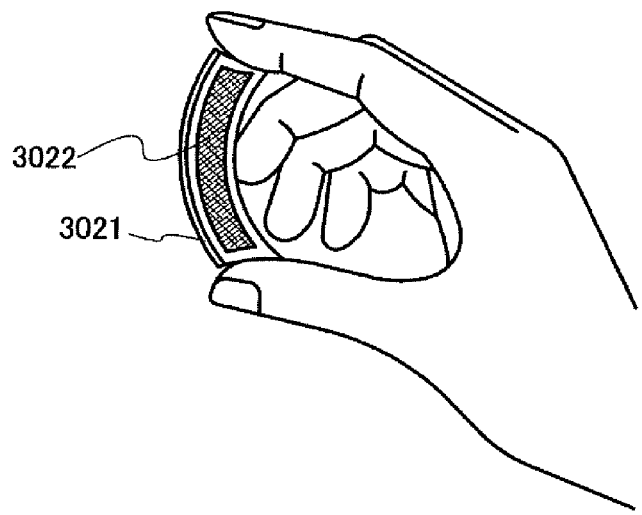

Note that in the case of an IC card illustrated in FIG. 15C, the IC card can be used even if transformed by being bent as illustrated in FIG. 15D by using a thin film transistor as a transistor included in the semiconductor device.

Figure 15E:

FIG. 15E illustrates a state of a completed product of a bearer bond 3031. A semiconductor device 3032 is embedded in the bearer bond 3031 and is protected by a resin which forms the periphery of the semiconductor device. The bearer bond 3031 can be formed in the same manner as an IC label, an IC tag, or an IC card. Note that the aforementioned bearer bond includes stamps, tickets, admission tickets, merchandise coupons, book coupons, stationery coupons, beer coupons, rice coupons, various gift coupons, various service coupons, and the like. It is needless to say that it is not limited thereto. In addition, the semiconductor device 3032 can be provided in bills, coins, securities, bearer bonds, certificates, or the like, so that an authentication function can be provided. Therefore, by using the authentication function, forgery can be prevented.

In addition, although not shown here, the efficiency of a system such as an inspection system can be improved by provision of the semiconductor device in, for example, books, packaging containers, storage media, personal belongings, foods, clothing, commodities, electronic devices, or the like. In addition, by providing the vehicles with the semiconductor device, forgery or theft can be prevented. In addition, when the semiconductor device is implanted into creatures such as animals, each creature can be identified easily. For example, when a wireless tag is implanted into creatures such as domestic animals, the year of birth, sex, breed and the like of them can be identified easily.

As described above, semiconductor devices of the above embodiment modes can be used for any product (including creatures), because damages of a transistor or the like can be reduced even when external stress such as bending can be applied thereto.

Embodiment Mode 8

In this embodiment mode, examples of usage modes of semiconductor devices of the above embodiment modes will be described. Semiconductor devices of the above embodiment modes can be made flexible by being separated from a substrate over which the semiconductor device has been formed. Concrete examples of electronic devices including semiconductor devices of the above embodiment modes are described with reference to FIGS. 16A to 16F. The electronic devices include liquid crystal display devices, EL display devices, television sets (also simply called TV, televisions or television receivers), mobile phones, and the like.

Figure 16A:
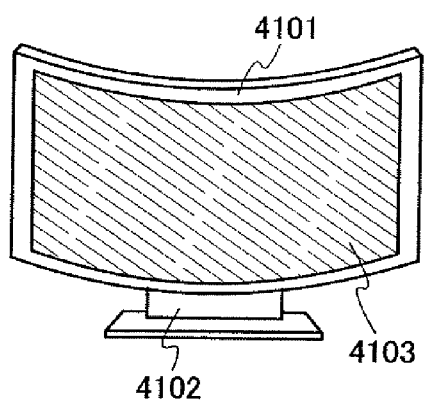
FIGS. 16A to 16F are views each showing an example of a usage mode of a semiconductor device.

FIG. 16A illustrates a display 4101, which includes a support 4102, a display portion 4103, and the like. The display portion 4103 is formed using a flexible substrate, which can realize a lightweight and thin display. In addition, the display portion 4103 can be curved, and can be detached from the support 4102 and the display can be mounted along a curved wall. A flexible display, which is one usage mode of a semiconductor device, can be formed by using a semiconductor device described in the above embodiment modes for the display portion 4103, an integrated circuit of a peripheral driver circuit, or the like. Thus, the flexible display can be provided over a curved portion as well as a flat surface; therefore, it can be used for various applications.

Figure 16B:
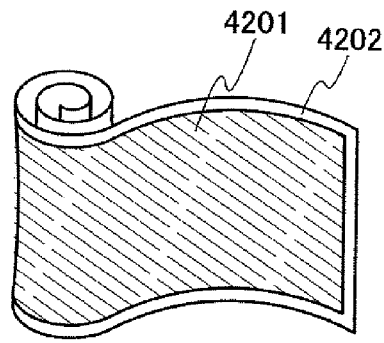

FIG. 16B illustrates a display 4202 that can be wound, which includes a display portion 4201, and the like. A thin and large-area display capable of being wound, which is one usage mode of a semiconductor device, can be manufactured by using semiconductor devices described in the above embodiment modes for the display portion 4201, an integrated circuit of a driver circuit, or the like. Since the display 4202 capable of being wound is formed using a flexible substrate, the display can be carried in a bent or wound state, along with the display portion 4201. Therefore, even in the case where the display 4202 capable of being wound is large-size, the display can be carried in a bag in a bent or wound state.

Figure 16C:
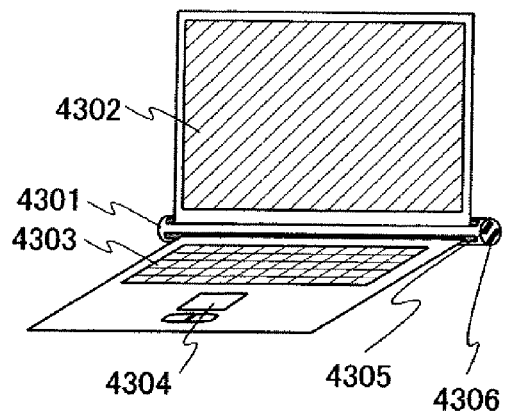

FIG. 16C illustrates a sheet-type computer 4301, which includes a display portion 4302, a keyboard 4303, a touch pad 4304, an external connection port 4305, a power plug 4306, and the like. A thin or sheet-type computer can be manufactured, which is one usage mode of a semiconductor device, by using a semiconductor device described in the above embodiment modes for the display portion 4302, an integrated circuit of a driver circuit, an information processing circuit, or the like. The display portion 4302 is formed using a flexible substrate to achieve a lightweight and thin computer. In addition, the display portion 4302 can be wound and stored in a main body if the main body of the sheet-type computer 4301 is provided with a storage space. In addition, by also forming the keyboard 4303 to be flexible, the keyboard 4303 can be wound and stored in the storage space of the sheet-type computer 4301 in a similar manner to the display portion 4302, which is convenient for carrying around. The computer can be stored without taking a place by bending when it is not used.

Figure 16D:
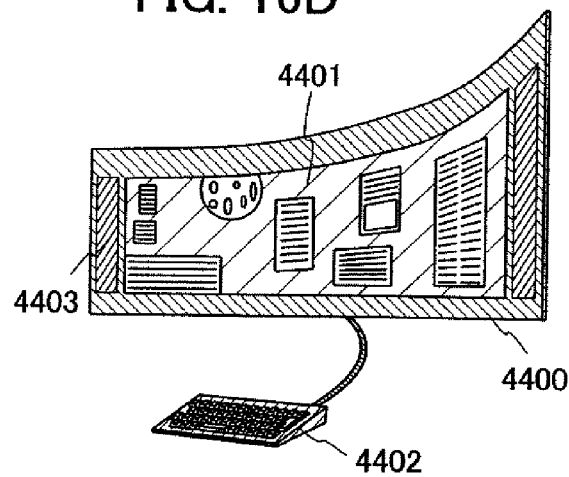

FIG. 16D illustrates a display device 4400 having a 20 to 80-inch large-sized display portion, which includes a keyboard 4402 that is an operation portion, a display portion 4401, a speaker 4403, and the like. The display portion 4401 is formed using a flexible substrate, and the display device 4400 can be carried in a bent or wound state with the keyboard 4402 detached. In addition, the connection between the keyboard 4402 and the display portion 4401 can be performed wirelessly. For example, the display device 4400 can be mounted along a curved wall and can be operated with the keyboard 4402 wirelessly.

In the example illustrated in FIG. 16D, a semiconductor device described in the above embodiment modes is used for the display portion 4401, an integrated circuit of a driver circuit of the display portion, a wireless communication circuit which controls communication between the display portion and the keyboard, or the like. Thus, a thin and large-area display device can be manufactured, which is one usage mode of a semiconductor device.

Figure 16E:
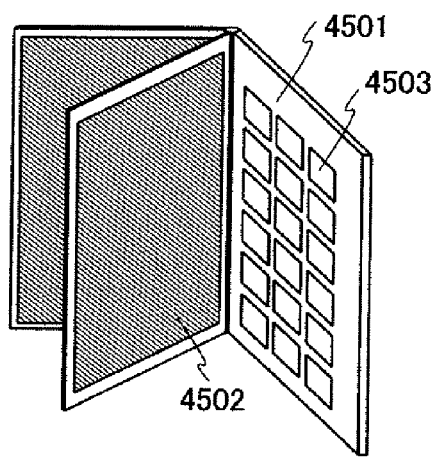

FIG. 16E illustrates an electronic book 4501 that includes a display portion 4502, an operating key 4503, and the like. In addition, a modem may be incorporated in the electronic book 4501. The display portion 4502 is formed using a flexible substrate and can be bent or wound. Therefore, the electronic book can also be carried without taking a place. Further, the display portion 4502 can display a moving image as well as a still image such as a character.

In the example illustrated in FIG. 16E, a semiconductor device described in the above embodiment modes is used for the display portion 4502, an integrated circuit of a driver circuit, a controlling circuit, or the like. Thus, a thin electronic book can be manufactured, which is one usage mode of a semiconductor device.

Figure 16F:
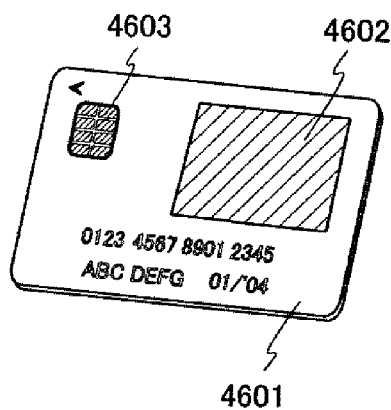

FIG. 16F illustrates an IC card 4601, which includes a display portion 4602, a connection terminal 4603, and the like. Since the display portion 4602 is formed to be a lightweight and thin sheet type using a flexible substrate, it can be attached to a card surface. When the IC card can receive data without contact, information obtained from outside can be displayed on the display portion 4602.

In the example illustrated in FIG. 16F, a semiconductor device described in the above embodiment modes is used for the display portion 4602, an integrated circuit of a wireless communication circuit, or the like. Thus, a thin IC card can be manufactured, which is one usage mode of a semiconductor device.

As described above, by using a semiconductor device of the above embodiment modes for electronic devices, electronic devices which are bendable can be manufactured. The neutral plane can be located at the position where generation of stress in the semiconductor film 106 can be suppressed, in the thickness direction of an electronic device, even when external stress such as bending is applied to the electronic device. Therefore, it is possible to suppress generation of stress in the semiconductor film 106, even when external force such as bending is applied to the electronic device. Accordingly, damages to the semiconductor film 106 can be reduced and yield and reliability of the electronic device can be increased.

As described above, the application range of the present invention is so wide that the present invention can be applied to electronic devices and information displaying means in a wide variety of fields.

EXAMPLE 1

In Example 1, in a case where external stress such as bending is applied to a semiconductor device according to Embodiment Mode 1, distribution of stress generated in a semiconductor film was examined by computation (simulation). From obtained stress distribution, thicknesses of a first reinforcement film and a second reinforcement film which were suitable for suppressing stress generated in the semiconductor film were examined by computation, and the obtained results are described below.

In order to obtain optimum thicknesses of the first reinforcement film and the second reinforcement film, a combination of the thicknesses of the first reinforcement film and the second reinforcement film was changed to various combinations, and analysis by a finite element method simulating a four-point bending test was conducted to obtain distribution of stress generated in the semiconductor device. From the obtained stress distribution, maximum values of Mises equivalent stress generated in the semiconductor film (in particular, a channel formation region) were obtained. Note that the phrase "Mises equivalent stress" defined in this specification is a value which is obtained by converting stress in each direction obtained from computation simulation used in general, to a scalar quantity.

The distribution stress generated in the semiconductor device can be obtained by computation simulation used in general, such as stress analysis software. An analysis model was formed from parts constituting the semiconductor device, and a size, a shape, Young's modulus, Poisson's ratio, load and other parameters of each part of the analysis model were input to stress analysis software of a computer, and stress distribution generated in each part due to bending was analyzed. Here, the term "part" includes any component constituting the semiconductor device as well as an insulating film, a reinforcement film, a semiconductor film, a gate insulating film, and a gate electrode described above. In this example, as the stress analysis software, a production name "ANSYS" (CYBERNET SYSTEMS Co., Ltd) was used.

Figure 17:
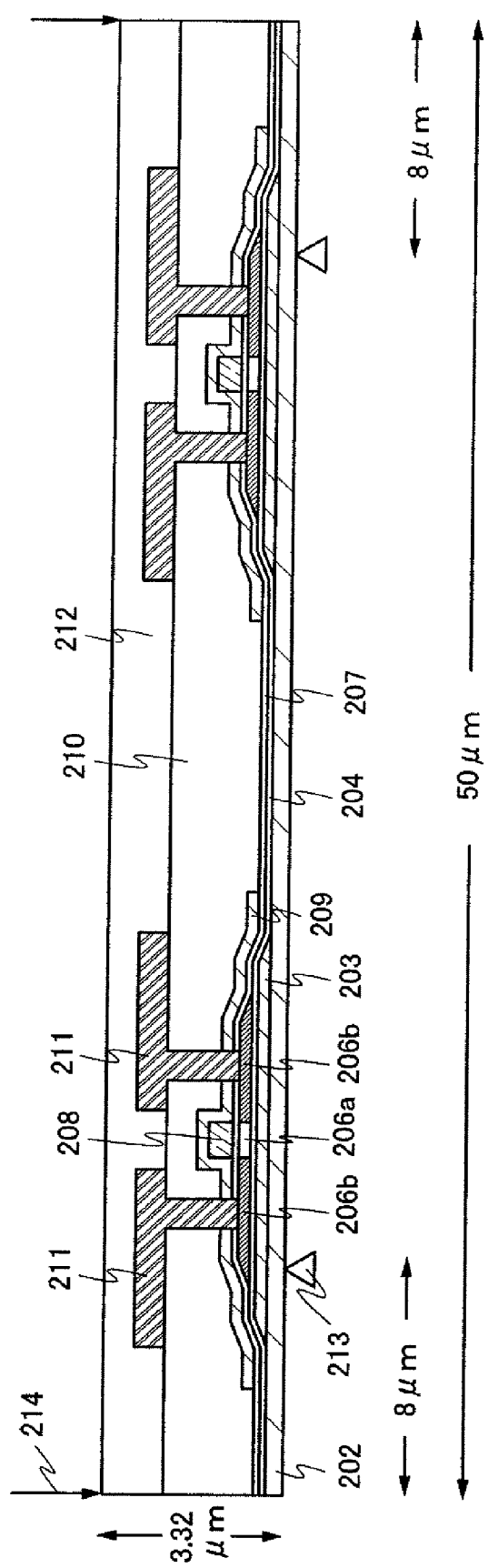
FIG. 17 illustrates a model used for simulation.

FIG. 17 illustrates an analysis model used for computation.

As an insulating film 202 serving as a buffer layer, silicon oxynitride (thickness: 200 nm) was assumed. As a first reinforcement film 203 over the insulating film 202, silicon nitride (thickness: 0 nm, 50 nm, 100 nm, 150 nm, 200 nm, and 400 nm) was assumed. In addition, an insulating film 204 was assumed to be silicon oxynitride (thickness: 100 nm) and was stacked to cover the insulating film 202 and the reinforcement film 203. An island-like semiconductor film 206, a gate insulating film 207, and a conductive film 208 serving as a gate electrode were assumed to be silicon (thickness: 66 nm), silicon oxide (thickness: 20 nm), and tungsten (thickness: 100 nm), respectively. In addition, a second reinforcement film 209 was assumed to be silicon nitride (thickness: 0 nm, 100 nm, 150 nm, 200 nm and 400 nm), and an interlayer insulating film 210, a conductive film 211 serving as a source electrode and a drain electrode, and an insulating film 212 were assumed to be silicon oxynitride (thickness: 1.5 μm), aluminum (thickness: 700 nm) and polyimide (thickness: 1.5 μm), respectively. The size of the semiconductor device was 50 μm×3.32 μm. Note that a sheet (or a substrate) was omitted for simple computation.

Table 1 shows Young's modulus and Poisson's ratio of each part used for the computation.

TABLE 1

| material | Young's modulus [MPa] | Poisson's ratio |
|---|---|---|
| silicon | 1.70E+05 | 0.3 |
| silicon oxynitride | 6.82E+04 | 0.25 |
| silicon nitride oxide | 1.96E+05 | 0.25 |
| silicon oxide | 4.50E+04 | 0.25 |
| aluminum | 7.00E+04 | 0.33 |
| tungsten | 5.34E+05 | 0.22 |
| polyimide | 6.19E+03 | 0.25 |

In addition, supporting points 213 were provided at positions which were each 8 μm apart from the end portion of the simulation model in FIG. 17, and load of 0.05 N was applied to the simulation model as illustrated by arrows 214, and thereby four-point bending was assumed.

FIGS. 18A and 18B and FIGS. 19A and 19B illustrate stress distribution generated in the semiconductor device, which was analyzed by a finite element method using the stress analysis software. FIG. 18A illustrates a case in which the first and second reinforcement films are not provided, while FIG. 18B illustrates a case in which the first and second reinforcement films are provided. Moreover, FIG. 19A illustrates a case in which only the first reinforcement film is provided, while FIG. 19B illustrates a case in which only the second reinforcement film is provided. Note that in the stress distribution, as the color of a part is darker, the stress value of the part is higher.

There were included stresses having various properties, which were obtained by a finite element method, depending on the structure of the model. Thus, in this example, stress of computation results by a finite element method was evaluated with Mises equivalent stress. In addition, stress generated in the thin film transistor was evaluated with a maximum value of Mises equivalent stress of the channel formation region 206a, focusing on the stress of the channel formation region 206a in consideration of the probability of damages in films.

Table 2 shows stress generated in the channel formation region 206a with maximum values of Mises equivalent stress.

TABLE 2

| | | thickness of upper layer [nm] | | | | | |
|---|---|---|---|---|---|---|---|
| | | 0 stress [MPa] | 100 stress [MPa] | 150 stress [MPa] | 200 stress [MPa] | 300 stress [MPa] | 400 stress [MPa] |
| thickness of lower layer [nm] | 0 | 44 | 47 | 47 | 48 | 49 | 50 |
| | 50 | 41 | 36 | 36 | 36 | 37 | 38 |
| | 100 | 56 | 35 | 31 | 28 | 27 | 30 |
| | 150 | 73 | 47 | 43 | 36 | 34 | 32 |
| | 200 | 87 | 58 | 54 | 36 | 44 | 40 |
| | 400 | 143 | 102 | 95 | 36 | 80 | 72 |

FIGS. 20A and 20B and FIGS. 21A and 21B illustrate stress distribution generated in the channel formation region, which was analyzed by a finite element method. FIGS. 20A and 20B and FIGS. 21A and 21B illustrate enlarged channel formation regions and in the stress distribution, as the color of a part is darker, the stress value of the part is higher. Note that stress distribution except stress distribution in the semiconductor film 206 is not illustrated.

Figure 20A:
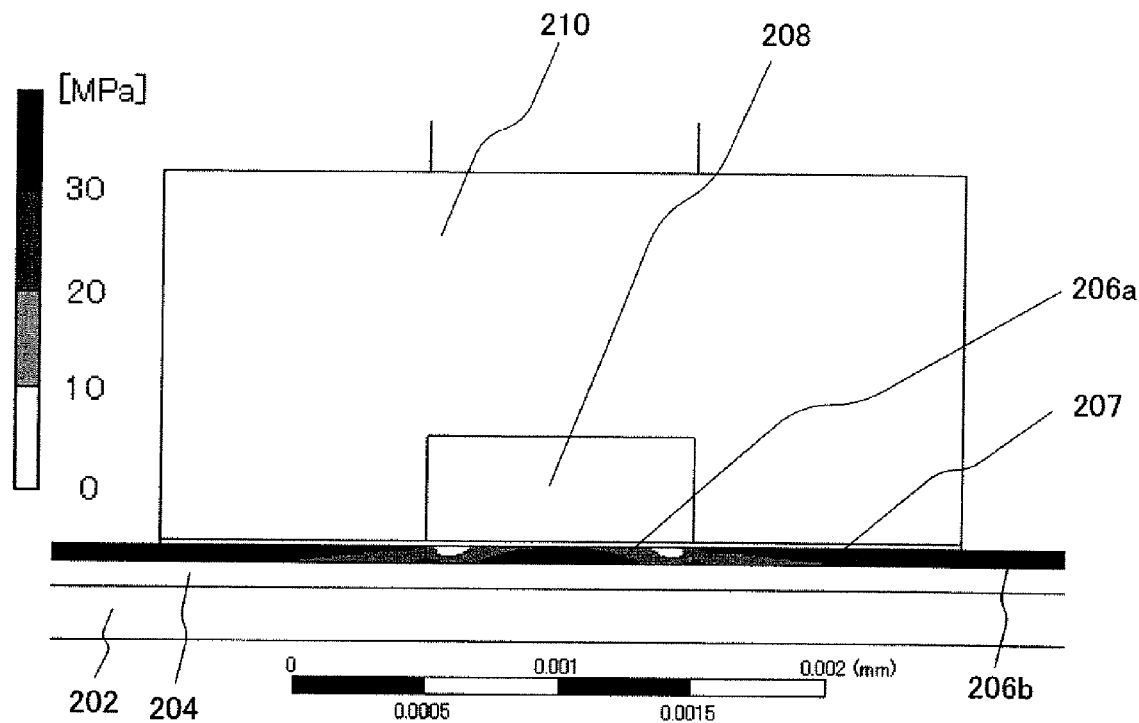
FIGS. 20A and 20B illustrate stress distribution of a channel formation region obtained by simulation.

FIG. 20A illustrates stress distribution generated in the channel formation region in a case where the first and second reinforcement films 203 and 209 were not provided (each thickness of the first and second reinforcement films 203 and 209 is 0 nm). It can be seen that high stress was generated under the center of the channel formation region. This elucidates that the neutral plane of the semiconductor device was located on the gate electrode side. The maximum value of Mises equivalent stress was 44 MPa at this time.

Figure 20B:
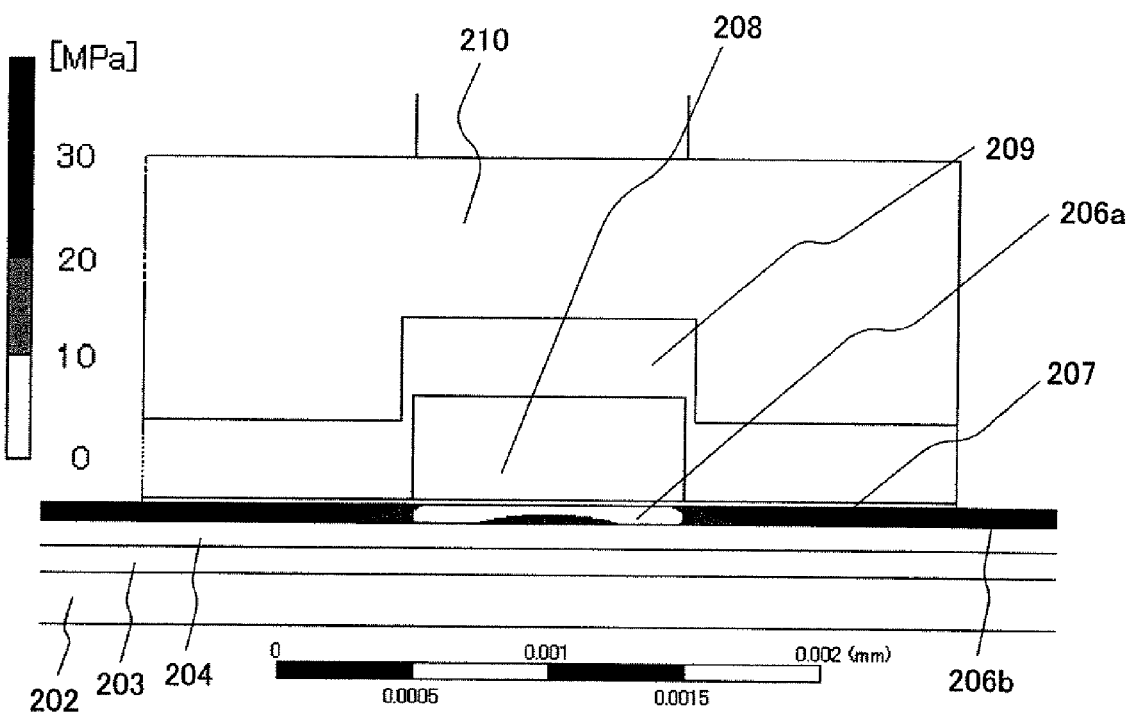

FIG. 20B illustrates stress distribution generated in the channel formation region in a case where the first and second reinforcement films were provided (thicknesses of the first and second reinforcement films were 100 nm and 300 nm, respectively). It can be seen that stress of 30 MPa or more was not generated in the case where the first and second reinforcement films were provided. This is because the neutral plane of the semiconductor device is moved toward the first reinforcement film 203 side, as compared with the case of FIG. 20A. The maximum value of Mises equivalent stress was 27 MPa at this time, and stress can be reduced by about 40% as compared with the case of FIG. 20A.

Figure 21A:
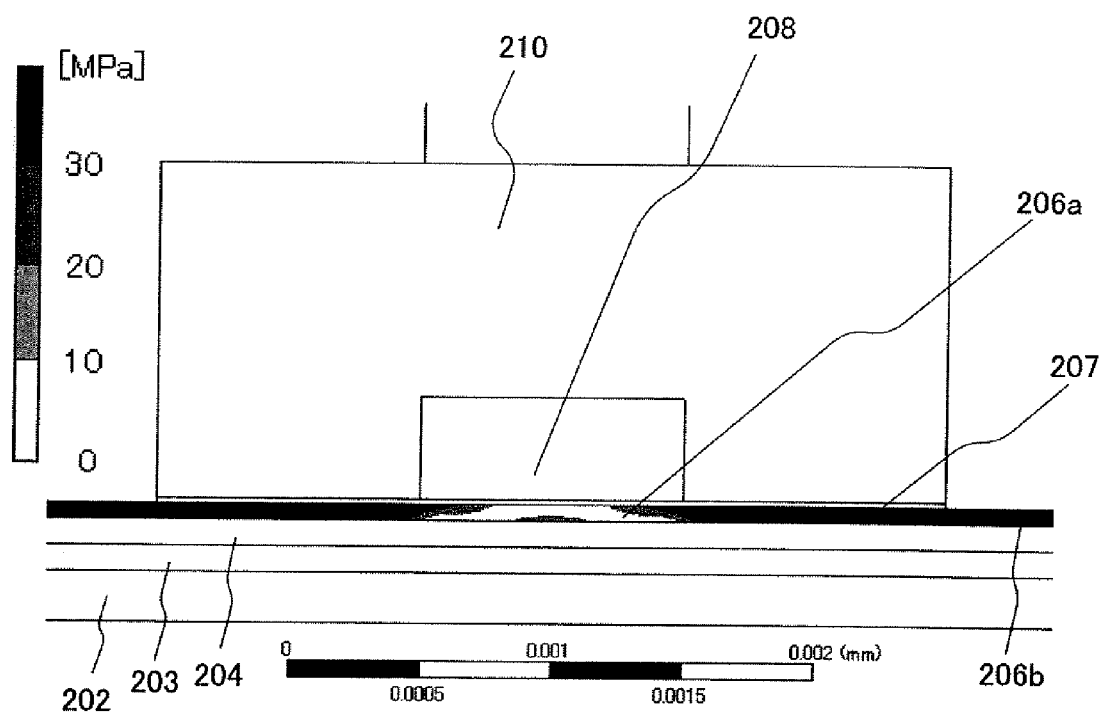
FIGS. 21A and 21B illustrate stress distribution of a channel formation region obtained by simulation.

Moreover; FIG. 21A illustrates stress distribution generated in the channel formation region in a case where only the first reinforcement film (thickness: 100 nm) was provided. In the case where only the first reinforcement film 203 was provided, the location of the neutral plane of the semiconductor device moves more toward the first reinforcement film 203 side, as compared with the case of FIG. 20B, and thus, high stress was generated in an upper end portion of the channel formation region. The maximum value of Mises equivalent stress was 56 MPa at this time.

Figure 21B:
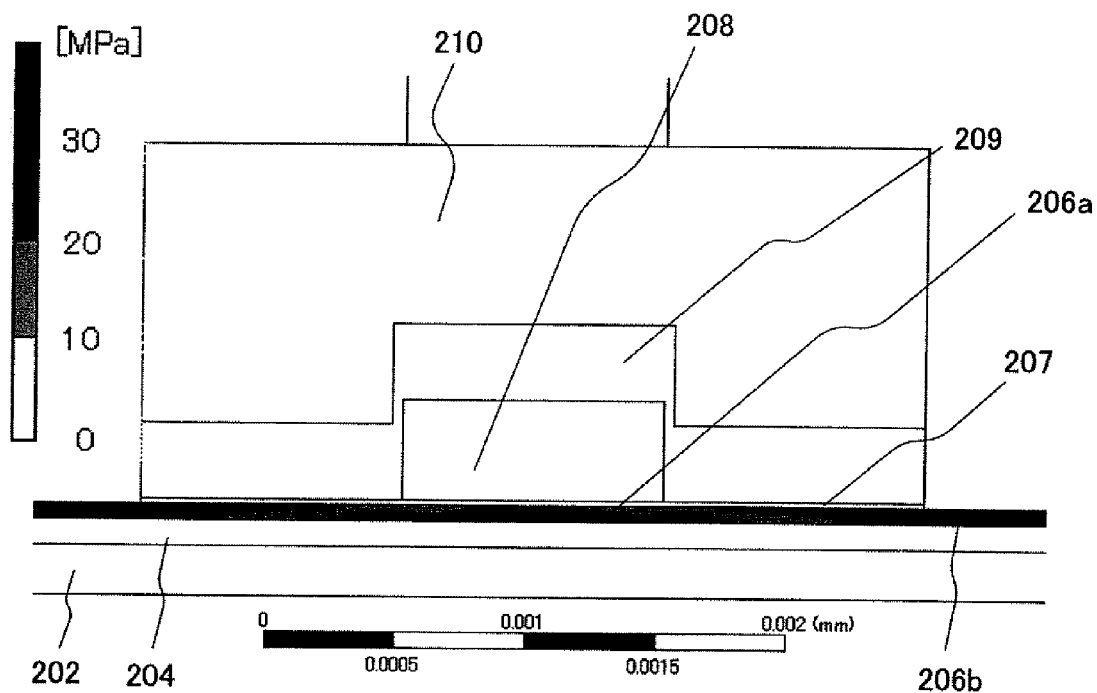

FIG. 21B illustrates stress distribution generated in the channel formation region in a case where only the second reinforcement film (thickness: 300 nm) was provided. In the case where only the second reinforcement film was provided, the location of the neutral plane of the semiconductor device moves more toward the gate electrode side, as compared with the case of FIG. 20A, and thus, high stress is generated under the center of the channel formation region. The maximum value of Mises equivalent stress was 49 MPa at this time.

The stress distributions in the channel formation regions in the case where the first and second reinforcement films are not provided (FIG. 20A) and in the case where the first and second reinforcement films are provided (FIG. 20B) were compared, it can be seen that Mises equivalent stress can be reduced by 40%. This is because the position of the neutral plane in the semiconductor device is changed and stress generated in the channel formation region can be suppressed by provision of the reinforcement films above and below the semiconductor film.

In addition, as illustrated in FIGS. 21A and 21B, in the case where only the first reinforcement film or only the second reinforcement film is provided, stress is higher than that in the case where the reinforcement films are not provided, which elucidates that stress generated in the channel formation region cannot always be suppressed.

According to the analysis results, it can be seen it is preferred that the thickness of the first reinforcement film is set in the range of from 50 nm to 200 nm and the thickness of the second reinforcement film is set in the range of from 100 nm to 400 nm, because the maximum value of Mises equivalent stress was 44 MPa in the case where the first and second reinforcement films were not provided. Further, it can be seen that the maximum value of Mises equivalent stress can be reduced in the case where the thickness of the second reinforcement film is larger than that of the first reinforcement film. Furthermore, it can be seen that the maximum value of Mises equivalent stress can be reduced in the case where the thickness ratio of the first reinforcement film to the second reinforcement film (the thickness of the first reinforcement film/the thickness of the second reinforcement film) is 1/2 or less.

As described above, the semiconductor film is provided to be interposed between the reinforcement films which are formed of a material having higher Young's modulus than the semiconductor film, and thereby the neutral plane can be located at the position where generation of stress in the semiconductor film can be suppressed, in the thickness direction of the semiconductor device. In other words, the neutral plane of the semiconductor device can be located at a preferred position for the semiconductor device. Therefore, it is possible to suppress generation of stress in a semiconductor film, even when external force such as bending is applied to the semiconductor device. Accordingly, damages to an element such as a transistor can be reduced and yield and reliability of a semiconductor device can be increased.

This application is based on Japanese Patent Application serial no. 2007-312163 filed with Japan Patent Office on Dec. 3, 2007, the entire contents of which are hereby incorporated by reference.

What is claimed is:

1. A semiconductor device comprising:
   a first island-like film over a substrate having flexibility;
   a semiconductor film over the first island-like film;
   a conductive film over the semiconductor film with an insulating film interposed therebetween; and
   a second island-like film over the conductive film,
   wherein an entire region of the semiconductor film overlaps the first island-like film, and
   wherein the second island-like film overlaps the entire region of the semiconductor film.

2. The semiconductor device according to claim 1, wherein the first island-like film and the second island-like film are in contact with each other.

3. The semiconductor device according to claim 1, wherein the first island-like film has higher Young's modulus than the semiconductor film.

4. The semiconductor device according to claim 1, wherein the second island-like film is formed using the same material as the first island-like film.

5. The semiconductor device according to claim 1, wherein the first island-like film is formed using silicon nitride, silicon nitride oxide, metal oxide or metal nitride.

6. The semiconductor device according to claim 1, wherein a thickness of the first island-like film is from 50 nm to 200 nm, inclusive and a thickness of the second island-like film is from 100 nm to 400 nm, inclusive.

7. The semiconductor device according to claim 1, wherein a thickness of the second island-like film is larger than a thickness of the first island-like film.

8. The semiconductor device according to claim 1, wherein a thickness of the second island-like film is equal to a thickness of the first island-like film.

9. The semiconductor device according to claim 1, wherein a thickness ratio of the first island-like film to the second island-like film (the thickness of the first island-like film/the thickness of the second island-like film) is 1/2 or less.

10. A semiconductor device comprising:
    a transistor over a substrate having flexibility, the transistor including a gate electrode and a semiconductor film with a gate insulating film interposed therebetween;
    a first island-like film over the substrate having flexibility; and
    a second island-like film over the substrate having flexibility,
    wherein an entire region of the semiconductor film overlaps the first island-like film, and
    wherein the second island-like film overlaps the entire region of the semiconductor film.

11. The semiconductor device according to claim 10, wherein the first island-like film and the second island-like film are in contact with each other.

12. The semiconductor device according to claim 10, wherein the first island-like film has higher Young's modulus than the semiconductor film.

13. The semiconductor device according to claim 10, wherein the second island-like film is formed using the same material as the first island-like film.

14. The semiconductor device according to claim 10, wherein the first island-like film is formed using silicon nitride, silicon nitride oxide, metal oxide or metal nitride.

15. The semiconductor device according to claim 10, wherein a thickness of the first island-like film is from 50 nm to 200 nm, inclusive and a thickness of the second island-like film is from 100 nm to 400 nm, inclusive.

16. The semiconductor device according to claim 10, wherein a thickness of the second island-like film is larger than a thickness of the first island-like film.

17. The semiconductor device according to claim 10, wherein a thickness of the second island-like film is equal to a thickness of the first island-like film.

18. The semiconductor device according to claim 10, wherein a thickness ratio of the first island-like film to the second island-like film (the thickness of the first island-like film/the thickness of the second island-like film) is 1/2 or less.

19. A semiconductor device comprising:
    a first lower island-like film over a substrate having flexibility;
    a second lower island-like film over the substrate having flexibility;
    a first semiconductor film including a first channel formation region and a first impurity region over the first lower island-like film;
    a second semiconductor film including a second channel formation region and a second impurity region over the second lower island-like film;
    a first gate electrode over the first channel formation region with a first gate insulating film interposed therebetween;
    a second gate electrode over the second channel formation region with a second gate insulating film interposed therebetween;
    a first upper island-like film over the first gate electrode;
    a second upper island-like film over the second gate electrode; and
    an interlayer insulating film over the first upper island-like film and the second upper island-like film,
    wherein an entire region of the first channel formation region overlaps the first lower island-like film,
    wherein an entire region of the second channel formation region overlaps the second lower island-like film,
    wherein the first upper island-like film overlaps the entire region of the first channel formation region, and
    wherein the second upper island-like film overlaps the entire region of the second channel formation region.

20. The semiconductor device according to claim 19, wherein the first gate insulating film and the second gate insulating film are a continuous stretch of a gate insulating film,
    wherein the interlayer insulating film is in contact with the gate insulating film at an area between the first semiconductor film and the second semiconductor film.

21. The semiconductor device according to claim 19, further comprising:
- an insulating layer interposed between the first and second lower island-like films and the first and second semiconductor films,
- wherein the interlayer insulating film is in contact with the insulating layer at an area between the first semiconductor film and the second semiconductor film.

22. The semiconductor device according to claim 19, wherein the first upper island-like film and the second upper island-like film are a continuous stretch of an upper island-like film, and
- wherein the upper island-like film is in contact with the first lower island-like film and the second lower island-like film.

23. A semiconductor device comprising:
- a first island-like film over a substrate having flexibility;
- a first semiconductor film including a first channel formation region and a first impurity region over the first island-like film;
- a second semiconductor film including a second channel formation region and a second impurity region over the first island-like film;
- a first gate electrode over the first channel formation region with a gate insulating film interposed therebetween;
- a second gate electrode over the second channel formation region with the gate insulating film interposed therebetween; and
- a second island-like film over the first gate electrode and the second gate electrode,
- wherein an entire region of the first semiconductor film and an entire region of the second semiconductor film overlap the first island-like film, and
- wherein the second island-like film overlaps the entire region of the first semiconductor film and the entire region of the second semiconductor film.

24. A semiconductor device comprising:
- a plurality of first island-like films over a substrate having flexibility;
- a plurality of semiconductor films over the plurality of first island-like films, the plurality of semiconductor films selected from the group consisting of silicon nitride, silicon nitride oxide, metal oxide and metal nitride;
- a plurality of gate electrodes over the plurality of semiconductor films with a gate insulating film interposed between the plurality of gate electrodes and the plurality of semiconductor films;
- a plurality of second island-like films over the plurality of gate electrodes;
- a first insulating film over the plurality of second island-like films;
- a first conductive film over the first insulating film, the first conductive film electrically connected to one of the plurality of semiconductor films;
- a second insulating film over the first conductive film; and
- an antenna over the second insulating film,
- wherein an entire periphery of each of the plurality of semiconductor films is located inside a periphery of one of the plurality of first island-like films, and
- wherein the entire periphery of each of the plurality of semiconductor films is located inside a periphery of one of the plurality of second island-like films.

25. A semiconductor device comprising:
- a plurality of first island-like films over a first substrate having flexibility;
- a plurality of semiconductor films over the plurality of first island-like films, the plurality of semiconductor films selected from the group consisting of silicon nitride, silicon nitride oxide, metal oxide and metal nitride;
- a plurality of gate electrodes over the plurality of semiconductor films with a gate insulating film interposed between the plurality of gate electrodes and the plurality of semiconductor films;
- a plurality of second island-like films over the plurality of gate electrodes;
- a first insulating film over the plurality of second island-like films;
- a first conductive film over the first insulating film, the first conductive film electrically connected to one of the plurality of semiconductor films;
- a second insulating film over the first conductive film;
- a second conductive film over the second insulating film; and
- an antenna formed on a second substrate bonded to the first substrate, the antenna electrically connected to the second conductive film,
- wherein an entire periphery of each of the plurality of semiconductor films is located inside a periphery of one of the plurality of first island-like films, and
- wherein the entire periphery of each of the plurality of semiconductor films is located inside a periphery of one of the plurality of second island-like films.

* * * * *